(12) United States Patent
Allen et al.

(10) Patent No.: US 7,951,524 B2
(45) Date of Patent: May 31, 2011

(54) SELF-TOPCOATING PHOTORESIST FOR PHOTOLITHOGRAPHY

(75) Inventors: Robert Allen, San Jose, CA (US); Phillip Brock, Sunnyvale, CA (US); Shiro Kusumoto, Yokkaichie (JP); Yukio Nishimura, Yokkaichi (JP); Daniel P. Sanders, San Jose, CA (US); Mark Steven Slezak, San Jose, CA (US); Ratnam Sooriyakumaran, San Jose, CA (US); Linda K. Sundberg, Los Gatos, CA (US); Hoa Trung, San Jose, CA (US); Gregory M. Wallraff, San Jose, CA (US)

(73) Assignees: International Business Machines Corporation, Armonk, NY (US); JSR Micro Inc., Sunnyvale, CA (US)

(*) Notice: Subject to any disclaimer, the term of this patent is extended or adjusted under 35 U.S.C. 154(b) by 527 days.

(21) Appl. No.: 12/023,108

(22) Filed: Jan. 31, 2008

(65) Prior Publication Data

US 2008/0193879 A1    Aug. 14, 2008

Related U.S. Application Data

(63) Continuation-in-part of application No. 11/865,115, filed on Oct. 1, 2007, now abandoned, which is a continuation-in-part of application No. 11/380,744, filed on Apr. 28, 2006, and a continuation-in-part of application No. 11/380,731, filed on Apr. 28, 2006, and a continuation-in-part of application No. 11/380,782, filed on Apr. 28, 2006, now Pat. No. 7,521,172.

(51) Int. Cl.
  G03F 7/039 (2006.01)
  G03F 7/20 (2006.01)
  G03F 7/30 (2006.01)
  G03F 7/36 (2006.01)
  G03F 7/38 (2006.01)

(52) U.S. Cl. ............ 430/270.1; 430/907; 430/910; 430/326; 430/311; 430/330; 430/313; 526/242; 526/245

(58) Field of Classification Search ............ None
See application file for complete search history.

(56) References Cited

U.S. PATENT DOCUMENTS

| | | | |
|---|---|---|---|
| 3,981,987 A | 9/1976 | Linke et al. |
| 4,189,323 A | 2/1980 | Buhr |
| 4,255,299 A | 3/1981 | Daimon et al. |
| 4,395,566 A | 7/1983 | Covill et al. |
| 4,472,494 A | 9/1984 | Hallman et al. |
| 4,551,519 A | 11/1985 | Oxenrider |
| 4,647,651 A | 3/1987 | Oxenrider |
| 4,731,605 A | 3/1988 | Nixon |
| 5,240,812 A | 8/1993 | Conley et al. |
| 5,580,694 A | 12/1996 | Allen et al. |
| 5,595,861 A | 1/1997 | Garza |
| 5,679,495 A | 10/1997 | Yamachika et al. |
| 5,744,537 A | 4/1998 | Brunsvold et al. |
| 5,879,853 A | 3/1999 | Azuma |
| 6,057,080 A | 5/2000 | Brunsvold et al. |
| 6,191,476 B1 | 2/2001 | Takahashi et al. |
| 6,274,295 B1 | 8/2001 | Dammel et al. |
| 6,835,269 B1 | 12/2004 | Miharu et al. |
| 6,844,134 B2 | 1/2005 | Choi et al. |
| 7,067,231 B2 | 6/2006 | Harada et al. |
| 2001/0006736 A1 | 7/2001 | Kuroda et al. |
| 2002/0168581 A1 | 11/2002 | Takeda et al. |
| 2002/0182541 A1 | 12/2002 | Gonsalves |
| 2003/0224283 A1 | 12/2003 | Allen et al. |
| 2004/0013980 A1 | 1/2004 | Hatakeyama et al. |
| 2004/0137362 A1 | 7/2004 | De et al. |
| 2004/0166436 A1 | 8/2004 | Rhodes et al. |
| 2004/0242821 A1 | 12/2004 | Hatakeyama et al. |
| 2004/0265735 A1 | 12/2004 | Lee |
| 2005/0010012 A1 | 1/2005 | Jost et al. |
| 2005/0014090 A1 | 1/2005 | Hirayama et al. |
| 2005/0079443 A1 | 4/2005 | Noda et al. |
| 2005/0089792 A1 | 4/2005 | Huang et al. |
| 2005/0106494 A1 | 5/2005 | Huang et al. |
| 2005/0147920 A1 | 7/2005 | Lin et al. |
| 2005/0153236 A1 | 7/2005 | Lim et al. |
| 2005/0164502 A1 | 7/2005 | Deng et al. |
| 2005/0186516 A1 | 8/2005 | Endo et al. |
| 2005/0233254 A1 | 10/2005 | Hatakeyama et al. |
| 2005/0250898 A1 | 11/2005 | Maeda et al. |
| 2005/0266354 A1 | 12/2005 | Li et al. |
| 2006/0008748 A1 | 1/2006 | Inabe et al. |
| 2006/0105269 A1 | 5/2006 | Khojasteh et al. |
| 2006/0177765 A1 | 8/2006 | Harada et al. |
| 2006/0188804 A1 | 8/2006 | Allen et al. |
| 2006/0246373 A1 | 11/2006 | Wang |
| 2007/0254235 A1* | 11/2007 | Allen et al. ............ 430/270.1 |

FOREIGN PATENT DOCUMENTS

WO   WO0216517 A2   2/2002

OTHER PUBLICATIONS

Office Action (Mail Date Dec. 1, 2009) for U.S. Appl. No. 11/380,731, filed Apr. 28, 2006; Confirmation No. 3081.
Office Action (Mail Date Jan. 6, 2010) for U.S. Appl. No. 11/380,744, filed Apr. 28, 2006; Confirmation No. 3108.
Slezak, Mark; "Exploring the needs and tradeoffs for immersion resist topcoating", Solid State Technology, vol. 47, Issue 7, Jul. 2004. [online]. 5 pages. [retrieved on Jan. 20, 2010]. Retrieved from the Internet: < URL: http://www.electroiq.com/index/display/Semiconductor_Article_Tools_Template/_saveArticle/articles/solid-state-technology/volume-47/issue-7/features/photoresists/exploring-the-needs-and-tradeoffs-for-immersion-resist-topcoating.html >.

(Continued)

*Primary Examiner* — Sin J. Lee
(74) *Attorney, Agent, or Firm* — Schmeiser, Olsen & Watts

(57) ABSTRACT

Photoresist additive polymers and photoresist formulations that can be used in immersion lithography without the use of an additional topcoat. The resist compositions include a photoresist polymer, at least one photoacid generator, a solvent; and a photoresist additive polymer. Also a method of forming using photoresist formulations including photoresist additive polymers.

26 Claims, 1 Drawing Sheet

OTHER PUBLICATIONS

Hand, Aaron; "Tricks With Water and Light: 193 nm Extension"; Semiconductor International, vol. 27, Issue 2, Feb. 2004. [online]. 7 pages. [retrieved on Jan. 20, 2010]. Retrieved from the internet: < URL: http://www.semiconductor.net/article/print/209152-Tricks_With_Water_and_Light_193_nm_Extension.php >.

E. Reichmanis et al.; "Chemical Amplification Mechanisms for Microlithography"; Chemistry of Materials 1991 v. 3; pp. 394-407.

Allen, Robert D. et al.; "Design of Protective Topcoats for Immersion Lithography" Journal of Photopolymer Science and Technology 2005 v 18, n 5; pp. 615-619.

Eds. Thompson et al.; Introduction to Microlithography, Washington, DC, American Chemical Society (1994).

Ito, Hiroshi; Advances in Polymer Science 2005, v. 172, pp. 37-245, Chemical Amplification Resists for Microlithography.

Huang et al.; "New 193nm Top Antireflective Coatings for Superior Swing Reduction"; Proceedings of SPIE, vol. 6153, 61530S-1-61530S-8 (2006).

Sanders et al.; Fluoroalcohol Materials with Tailored Interfacial Properties for Immersion Lithography; 12 pages.

Office Action (Mail Date Apr. 21, 2008) for U.S. Appl. No. 11/380,782, filed Apr. 28, 2006; Confirmation No. 3177.

Office Action (Mail Date Aug. 7, 2008) for U.S. Appl. No. 11/380,731, filed Apr. 28, 2006; Confirmation No. 3081.

Office Action (Mail Date Oct. 7, 2008) for U.S. Appl. No. 11/380,744, filed Apr. 28, 2006; Confirmation No. 3108.

* cited by examiner

SELF-TOPCOATING PHOTORESIST FOR PHOTOLITHOGRAPHY

The present application is a continuation-in-part of patent application Ser. No. 11/865,115 filed on Oct. 1, 2007 now abandoned which is a continuation-in-part of Ser. No. 11/380,744 filed Apr. 28, 2006, Ser. No. 11/380,731 filed Apr. 28, 2006, and Ser. No. 11/380,782 filed Apr. 28, 2006 now U.S. Pat. No. 7,521,172, all of which are hereby incorporated by reference in their entireties.

FIELD OF THE INVENTION

The present invention relates to the fields of chemistry, photolithography and semiconductor fabrication. More specifically, the invention is directed to photoresist additive polymers, photoresist formulations mixed with the photoresist additive polymers and a method of forming a photolithographic image using photoresist formulations mixed with the photoresist additive polymers.

BACKGROUND

The continuous drive to print smaller structures for advanced electronic device manufacturing requires the use of higher resolution optical lithography tools. Immersion lithography has the potential to extend current 193 nm technology to 45 nm critical dimensions and beyond by enabling lens designs with NA greater than 1.0, thus resulting in an increased resolution of optical scanning exposure tools. In addition, immersion lithography effectively improves the depth-of-focus processing window. Immersion lithography requires filling the gap between the last lens element of the exposure tool and the photoresist-coated substrate with an immersion fluid such as water.

One of the technical challenges facing liquid immersion lithography is the possibility of inter-diffusion between the photoresist components and the immersion medium. That is, during the immersion lithographic process, the photoresist components can leach into the immersion medium and the immersion medium can permeate into the photoresist layer. Such extraction of photoresist components is detrimental to photoresist performance and might result in lens damage or contamination of expensive lithography tools. Therefore, there is a need for materials and methods to prevent or reduce interaction between photoresist layers and immersion fluid in an immersion lithography system.

SUMMARY OF THE INVENTION

A first aspect of the present invention is a polymer comprising repeat units with the following formulae:

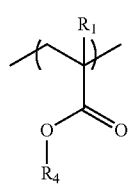

M1

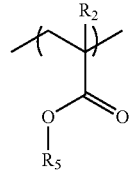

M2

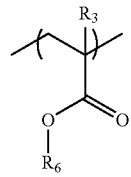

M3 wherein: $R_1$, $R_2$, and $R_3$ are independently hydrogen, fluorine, alkyl, or fluoroalkyl; $R_4$ is (i) a linear, branched, or cyclic alkylene containing one or more fluoroalcohol groups that are unprotected or partially or fully protected with an acid-labile group, or (ii) a linear, branched or cyclic heteroalkylene containing one or more fluoroalcohol groups that are unprotected or partially or fully protected with an acid-labile group; $R_5$ is (i) a hydrogen or linear, branched, or cyclic alkylene group that is acid-labile, or (ii) a linear, branched or cyclic heteroalkylene group that is acid-labile, or (iii) a linear, branched, or cyclic alkylene group containing one or more carboxylic acid, sulfonamide, fluoroalcohol, or sulfonic acid moieties, that are unprotected or partially or fully protected with an acid-labile group, or (iv) a linear, branched or cyclic heteroalkylene group containing one or more carboxylic acid, sulfonamide, fluoroalcohol, or sulfonic acid moieties, that are unprotected or partially or fully protected with an acid-labile group; $R_6$ is a partially fluorinated or perfluorinated group, other than a fluorinated ether, that is acid-labile or non-acid labile; and M1 comprises about 1 mole % to about 30 mole % of the repeat units, M2 comprises at least 50 mole % of the repeat units, and M3 comprises about 1 mole % to about 49 mole % of the repeat units, and M1+M2+M3 does not exceed 100 mole %.

A second aspect of the present invention is a photoresist formulation, comprising: a photoresist polymer; at least one photoacid generator; a solvent; and a photoresist additive polymer comprising repeat units with the following formulae:

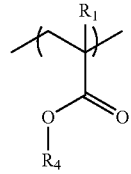

M1

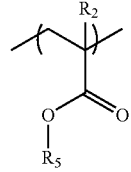

M2

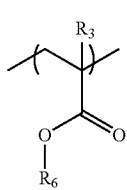

wherein: $R_1$, $R_2$, and $R_3$ are independently hydrogen, fluorine, alkyl, or fluoroalkyl; $R_4$ is (i) a linear, branched, or cyclic alkylene containing one or more fluoroalcohol groups that are unprotected or partially or fully protected with an acid-labile group, or (ii) a linear, branched or cyclic heteroalkylene containing one or more fluoroalcohol groups that are unprotected or partially or fully protected with an acid-labile group; $R_5$ is (i) a hydrogen or linear, branched, or cyclic alkylene group that is acid-labile, or (ii) a linear, branched or cyclic heteroalkylene group that is acid-labile, or (iii) a linear, branched, or cyclic alkylene group containing one or more carboxylic acid, sulfonamide, fluoroalcohol, or sulfonic acid moieties, that are unprotected or partially or fully protected with an acid-labile group, or (iv) a linear, branched or cyclic heteroalkylene group containing one or more carboxylic acid, sulfonamide, fluoroalcohol, or sulfonic acid moieties, that are unprotected or partially or fully protected with an acid-labile group; $R_6$ is a partially fluorinated or perfluorinated group, other than a fluorinated ether, that is acid-labile or non-acid labile; and M1 comprises about 1 mole % to about 30 mole % of the repeat units, M2 comprises at least 50 mole % of the repeat units, and M3 comprises about 1 mole % to about 49 mole % of the repeat units, and M1+M2+M3 does not exceed 100 mole %.

A third aspect of the present invention is a method, comprising: (a) forming a material layer on a top surface of a substrate; (b) coating the material layer with a photoresist formulation according to the second aspect of the present invention to form a photoresist layer; (c) exposing the photoresist layer to actinic radiation through a patterned photomask to form exposed regions in the photoresist layer, thereby forming an exposed photoresist layer; and (d) developing the exposed photoresist layer in an aqueous alkaline solution to generate a patterned photoresist layer wherein regions of the photoresist layer are removed to expose corresponding regions of the material layer.

BRIEF DESCRIPTION OF THE DRAWINGS

The invention will now be described in greater detail with reference to the drawings, wherein.

DETAILED DESCRIPTION OF THE INVENTION

Figure 1A:
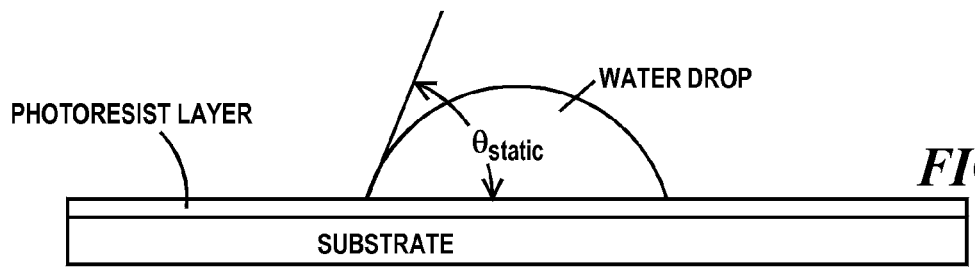
FIG. 1A shows the static water contact angle when all participating phases (i.e., air, water and photoresist layer) have reached their natural equilibrium positions and the three phase line is not moving.

In this specification and in the claims that follow, reference will be made to a number of terms, which shall be defined to have the following meanings:

As used herein, the phrase "having the formula" or "having the structure" is not intended to be limiting and is used in the same way that the term "comprising" is commonly used.

The term "alkyl" as used herein refers to a linear or branched, saturated hydrocarbon substituent that, contains 1 to about 24 carbon atoms, such as methyl, ethyl, n-propyl, isopropyl, n-butyl, isobutyl, t-butyl, octyl, decyl, tetradecyl, hexadecyl, eicosyl, tetracosyl, and the like. Generally, although again not necessarily, alkyl groups herein contain 1 to about 12 carbon atoms. The term "lower alkyl" intends an alkyl group of 1 to 6 carbon atoms, and the term "cycloalkyl" intends a cyclic alkyl group, typically having 3 to 12, preferably 3 to 8, carbon atoms. The term "substituted alkyl" refers to alkyl substituted with one or more substituent groups, i.e., wherein a hydrogen atom is replaced with a non-hydrogen substituent group, and the terms "heteroatom-containing alkyl" and "heteroalkyl" refer to alkyl substituents in which at least one carbon atom is replaced with a heteroatom such as O, N, or S. If not otherwise indicated, the terms "alkyl" and "lower alkyl" include linear, branched, cyclic, unsubstituted, substituted, and/or heteroatom-containing alkyl and lower alkyl, respectively.

The term "alkylene" as used herein refers to a difunctional linear or branched saturated hydrocarbon linkage, typically although not necessarily containing 1 to about 24 carbon atoms, such as methylene, ethylene, n-propylene, n-butylene, n-hexylene, decylene, tetradecylene, hexadecylene, and the like. In one embodiment, alkylene linkages contain 1 to about 12 carbon atoms, and the term "lower alkylene" refers to an alkylene linkage of 1 to 6 carbon atoms, preferably 1 to 4 carbon atoms. The term "substituted alkylene" refers to an alkylene linkage substituted with one or more substituent groups, i.e., wherein a hydrogen atom is replaced with a non-hydrogen substituent group, and the terms "heteroatom-containing alkylene" and "heteroalkylene" refer to alkylene linkages in which at least one carbon atom is replaced with a heteroatom. If not otherwise indicated, the terms "alkylene" and "lower alkylene" include linear, branched, cyclic, unsubstituted, substituted, and/or heteroatom-containing alkylene and lower alkylene, respectively.

The term "alkoxy" as used herein refers to a group —O-alkyl wherein "alkyl" is as defined above.

The term "alicyclic" is used to refer to cyclic, non-aromatic compounds, substituents and linkages, e.g., cycloalkanes and cycloalkenes, cycloalkyl and cycloalkenyl substituents, and cycloalkylene, cycloalkenylene linkages polycyclic compounds, substituents, and linkages, including bridged bicyclic, compounds, substituents, and linkages. In one embodiment, alicyclic moieties herein contain 3 to about 30, typically 5 to about 14, carbon atoms. Unless otherwise indicated, the term "alicyclic" includes substituted and/or heteroatom-containing such moieties. It will be appreciated that the term "cyclic," as used herein, thus includes "alicyclic" moieties.

The term "heteroatom-containing" as in a "heteroatom-containing alkyl group" (also termed a "heteroalkyl" group) refers to a molecule, linkage or substituent in which one or more carbon atoms are replaced with an atom other than carbon, e.g., nitrogen, oxygen, sulfur, phosphorus or silicon, typically nitrogen, oxygen or sulfur. Similarly, the term "heteroalkyl" refers to an alkyl substituent that is heteroatom-containing, the term "heterocyclic" refers to a cyclic substituent that is heteroatom-containing. Examples of heteroalkyl groups include alkoxyalkyl, alkylsulfanyl-substituted alkyl, and the like.

Unless otherwise indicated, the term "hydrocarbyl" is to be interpreted as including substituted and/or heteroatom-containing hydrocarbyl moieties. "Hydrocarbyl" refers to univalent hydrocarbyl radicals containing 1 to about 30 carbon atoms, preferably 1 to about 18 carbon atoms, most preferably 1 to about 12 carbon atoms, including linear, branched, cyclic, alicyclic, and aromatic species. "Substituted hydrocarbyl" refers to hydrocarbyl substituted with one or more substituent groups, and the terms "heteroatom-containing hydrocarbyl" and "heterohydrocarbyl" refer to hydrocarbyl in which at least one carbon atom is replaced with a heteroatom.

By "substituted" as in "substituted alkyl," and the like, as alluded to in some of the aforementioned definitions, is meant that in the alkyl, or other moiety, at least one hydrogen atom bound to a carbon (or other) atom is replaced with a non-hydrogen substituent. Examples of suitable substituents herein include halo, hydroxyl, sulfhydryl, $C_1$-$C_{12}$ alkoxy, acyl (including $C_2$-$C_{12}$ alkylcarbonyl (—CO-alkyl)), acyloxy (—O-acyl), $C_2$-$C_{12}$ alkoxycarbonyl (—(CO)—O-alkyl), $C_2$-$C_{12}$ alkylcarbonato (—O—(CO)—O-alkyl), carboxy (—COOH), carbamoyl (—(CO)—$NH_2$), mono-substituted $C_1$-$C_{12}$ alkylcarbamoyl (—(CO)—NH($C_1$-$C_{12}$ alkyl)), di-substituted alkylcarbamoyl (—(CO)—N($C_1$-$C_{12}$ alkyl)$_2$), cyano (—C≡N), cyanato (—O—C≡N), formyl (—(CO)—H), amino (—$NH_2$), mono- and di-($C_1$-$C_{12}$ alkyl)-substituted amino, mono- and $C_2$-$C_{12}$ alkylamido (—NH—(CO)-alkyl), imino (—CR=NH where R=hydrogen, $C_1$-$C_{12}$ alkyl. etc.), alkylimino (—CR=N(alkyl), where R=hydrogen, alkyl, etc.), $C_1$-$C_{20}$ alkylsulfanyl (—S-alkyl; also termed "alkylthio"), $C_5$-$C_{18}$ arylsulfanyl (—S-aryl; also termed "arylthio"), $C_1$-$C_{20}$ alkylsulfinyl (—(SO)-alkyl), $C_1$-$C_{20}$ alkylsulfonyl ($SO_2$-alkyl), phosphono (—P(O)(OH)$_2$), and the hydrocarbyl moieties $C_1$-$C_{24}$ alkyl (preferably $C_1$-$C_{12}$ alkyl). In addition, the aforementioned functional groups may, if a particular group permits, be further substituted with one or more additional functional groups or with one or more hydrocarbyl moieties such as those specifically enumerated above. Analogously, the above-mentioned hydrocarbyl moieties may be further substituted with one or more functional groups or additional hydrocarbyl moieties such as those specifically enumerated. When the term "substituted" appears prior to a list of possible substituted groups, it is intended that the term apply to every member of that group.

The term "fluorinated" refers to replacement of a hydrogen atom in a molecule or molecular segment with a fluorine atom, and includes perfluorinated moieties. The term "perfluorinated" is also used in its conventional sense to refer to a molecule or molecular segment wherein all hydrogen atoms are replaced with fluorine atoms. Thus, a "fluorinated" methyl group encompasses —$CH_2F$ and —$CHF_2$ as well as the "perfluorinated" methyl group, i.e., —$CF_3$ (trifluoromethyl). The term "fluoroalkyl" refers to a fluorinated alkyl group, the term "fluoroalkylene" refers to a fluorinated alkylene linkage, the term "fluoroalicyclic" refers to a fluorinated alicyclic moiety, and the like. "Fluorocarbyl" refers to fluorinated hydrocarbyl group.

A fluoroalcohol is defined as a organic compound bearing a hydroxyl group wherein one or more non-hydroxyl group hydrogen atoms are replaced with fluorine atoms. The fluoroalcohol may be comprised of a linear, branched, cyclic, polycyclic, or aromatic structure. Many non-limiting examples of such fluoroalcohols may be found in H. Ito "Chemical Amplification Resists for Microlithography," *Adv. Polym. Sci.* 2005, 172, 37-245.

"Optional" or "optionally" means that the subsequently described circumstance may or may not occur, so that the description includes instances where the circumstance occurs and instances where it does not. For example, the phrase "optionally substituted" means that a non-hydrogen substituent may or may not be present on a given atom, and, thus, the description includes structures wherein a non-hydrogen substituent is present and structures wherein a non-hydrogen substituent is not present.

The term "acid-labile" refers to a molecular segment containing at least one covalent bond that is cleaved upon exposure to acid. Typically, the reaction of acid-cleavable groups herein with photogenerated acid occurs only, or is promoted greatly by, the application of heat. Those skilled in the art will recognize the various factors that influence the rate and ultimate degree of cleavage of acid-cleavable groups as well as the issues surrounding integration of the cleavage step into a viable manufacturing process. The product of the cleavage reaction is generally an acidic group, which, when present in sufficient quantities, imparts solubility to the polymers of the invention in basic aqueous solutions.

Analogously, the term "acid-inert" refers to a substituent that is not cleaved or otherwise chemically modified upon contact with photogenerated acid.

The terms "photogenerated acid" and "photoacid" are used interchangeably herein to refer to the acid that is created upon exposure of the present photoresist formulations to radiation, by virtue of the photoacid generator contained in the compositions.

The term "substantially transparent" as used to describe a polymer that is "substantially transparent" to radiation of a particular wavelength refers to a polymer that has an absorbance of less than about 5.0/micron, preferably less than about 3.0/micron, most preferably less than about 1.5/micron, at a selected wavelength.

For additional information concerning terms used in the field of lithography and lithographic compositions, see *Introduction to Microlithography*, Eds. Thompson et al. (Washington, D.C.: American Chemical Society, 1994).

The present invention is directed in one embodiment to a photoresist additive polymer designed to be added to a photoresist formulation. Photoresist formulations have at least three components, a photoresist polymer or oligomer, a photoacid generator and a casting solvent. After application of the photoresist formulation with the photoresist additive polymer to form a photoresist layer, the photoresist additive polymer segregates to the surface of the photoresist layer and acts as an in-situ topcoat or self-topcoating photoresist. The photoresist additive polymer leads to high water contact angles but maintains good lithographic performance and reduces the leaching of photoresist components (e.g., photoacid generators or PAGs) into the immersion fluid.

The photoresist additive polymers of the current invention have the following properties:

(1) are soluble in photoresist formulation;

(2) have a high surface activity;

(3) do not alter the dissolution of the photoresist (e.g., the development process) significantly after exposure and bake;

(4) have the ability to block or reduce photoresist component leaching;

(5) exhibit a receding water contact angle of greater than about 55° and preferably greater than about 65°;

(6) exhibit advancing water contact angle of less than about 95° and preferably less than about 90°; and (7) are hydrophobic in acidic aqueous solutions and hydrophilic in basic aqueous solutions.

It has been found that high receding water contact angles are required to avoid film pulling behind the meniscus as the wafer travels underneath the immersion showerhead of the immersion lithography exposure tool. Film pulling results in a trail of fluid film or droplets being left behind on the wafer. Subsequent evaporation of this residual water has been positively correlated with increasing defects in the printed patterns. Several mechanisms involved in the formation of defects include concentration of extracted materials in the immersion fluid and subsequent deposition on the wafer during drying, localized swelling, and inter-diffusion between the topcoat and photoresist at the spot of droplet evaporation. Collectively, these printed defects are referred to as watermarks. In addition, the heat of evaporation of the water results in wafer cooling and causes thermal shrinkage of the photoresist layer and overlay problems. For standard wafer scan rates of about 500 mm/s, topcoat or photoresist materials should have a receding water contact angle greater than about 55° to avoid film pulling, with even higher receding water contact angles being advantageous. The required receding water contact angle to avoid film pulling will understandably vary according to the showerhead and fluid management strategy employed by the immersion tool manufacturers and the wafer scan rate, with higher scan rates requiring higher receding water contact angles. Additionally, the values vary slightly depending upon the specific technique employed to measure the water contact angles. Accordingly, these values should be considered only to be general guides.

Additionally, extremely high advancing water contact angles cause formation of a class of defects related to micro-bubbles. If the advancing water contact angles are too high (greater than about 95°), micro-bubbles of gas can be entrapped in the advancing meniscus at high scan rates. These micro-bubbles act like micro-lenses and lead to circular defects. As such, photoresists used without topcoats should have advancing water contact angles less than about 95° to avoid these issues. Again, the precise advancing water contact angle region in which this bubble defect mechanism occurs differs according to the showerhead design and fluid management strategy applied by different immersion scanner manufacturers.

The photoresist additive polymers of the present invention are either soluble in aqueous base developer or become soluble after exposure. The photoresist additive polymers of the present invention contain a low surface energy functionality, such as a fluorocarbyl moiety other than a fluorinated ether, in order to lower the surface energy. In one example, the photoresist additive polymers according to embodiments of the present invention have a fluorine content between about 10% by weight and about 40% by weight. In one example, the photoresist additive polymers according to embodiments of the present invention have a fluorine content between about 10% by weight and about 30% by weight. In one example, the photoresist additive polymers according to embodiments of the present invention have a fluorine content between about 10% by weight and about 20% by weight. In one example, the photoresist additive polymers according to embodiments of the present invention have a fluorine content between about 10% by weight and about 15% by weight In a one embodiment, the photoresist additive polymer comprise repeat units with the following formulae:

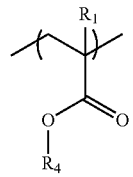

M1

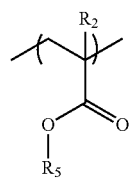

M2

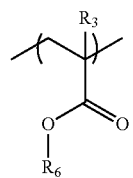

M3 wherein:

$R_1$, $R_2$, and $R_3$ are independently hydrogen, fluorine, alkyl, or fluoroalkyl;

$R_4$ is (i) a linear, branched, or cyclic alkylene containing one or more fluoroalcohol groups that are unprotected or partially or fully protected with an acid-labile group, or (ii) a linear, branched or cyclic heteroalkylene containing one or more fluoroalcohol groups that are unprotected or partially or fully protected with an acid-labile group;

$R_5$ is (i) a hydrogen or linear, branched, or cyclic alkylene group that is acid-labile, or (ii) a linear, branched or cyclic heteroalkylene group that is acid-labile, or (iii) a linear, branched, or cyclic alkylene group containing one or more carboxylic acid, sulfonamide, fluoroalcohol, or sulfonic acid moieties, that are unprotected or partially or fully protected with an acid-labile group, or (iv) a linear, branched or cyclic heteroalkylene group containing one or more carboxylic acid, sulfonamide, fluoroalcohol, or sulfonic acid moieties, that are unprotected or partially or fully protected with an acid-labile group;

$R_6$ is a partially fluorinated or perfluorinated group, other than a fluorinated ether, that is acid-labile or non-acid labile; and M1 comprises about 1 mole % to about 30 mole % of the repeat units, M2 comprises at least 50 mole % of the repeat units, and M3 comprises about 1 mole % to about 49 mole % of the repeat units with M1+M2+M3 not exceeding 100 mole % and preferably M1 comprises about 1 mole % to about 29 mole % of the repeat units, M2 comprises at least 70 mole % of the repeat units, and M3 comprises about 1 mole % to about 29 mole % of the repeat units with M1+M2+M3 not exceeding 100 mole %.

In one example, the sum of the mole % of the repeat units of M1, M2 and M3 equals at least 80 mole %. In one example, the sum of the mole % of the repeat units of M1, M2 and M3 equals at least 95 mole %.

The photoresist additive polymers of the embodiments of the present invention should be interpreted as representing a polymer $-(A_1-A_2-A_3 \ldots A_N)-$ where $A_1$ through $A_N$ are independently selected from the group consisting of the M1, M2 and M3 repeat units. The x, y, and z subscripts in the examples infra and in the claims indicate a mole % of x, a mole % of y and a mole % of z and do not indicate any particular order of repeat units. The examples should not be interpreted as requiring all the "x" repeat units to be linked to each other, or all the "y" repeat units to be linked to together or all the "z" repeat units to be linked together.

Mole % is the number of moles of each repeat unit in one mole of polymer. One mole of polymer is 100% mole percent. For example if a mole of a first repeat unit weighs 10 grams, a mole of a second repeat unit weighs 20 grams and a mole of a third repeat unit weighs 20 grams, a mole of polymer comprising about 33% mole percent of each of the three repeat unit would weigh about 50 grams. If a polymer was synthesized using 20 grams of each of the three repeat units, the mole % of the first repeat unit would be about 50%, the mole % of the second repeat unit would be about 25%, and the mole % of the third repeat unit would be about 25%.

The present invention is also directed to photoresist additive polymers the following example compositions 14 through 31.

EXAMPLES 14, 15, 16 AND 17

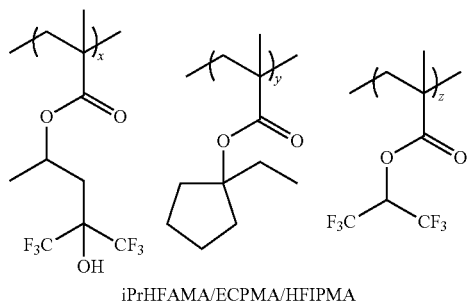

iPrHFAMA/ECPMA/HFIPMA wherein x:y:z=1-30 mole %: 98-50 mole %: 1-49 mole % and x+y+z does not exceed 100 mole %; as exemplified by:
Polymer 14: x=5 mole %, y=50 mole %, z=45 mole %;
Polymer 15: x=10 mole %, y=50 mole %, z=40 mole %;
Polymer 16: x=20 mole %, y=50 mole %, z=30 mole %; and
Polymer 17: x=30 mole %, y=50 mole %, z=20 mole %.

EXAMPLES 18, 19, 20 AND 21

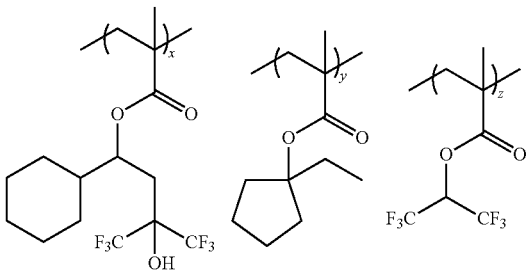

CHiPrHFAMA/ECPMA/HFIPMA wherein x:y:z=1-30 mole %: 98-50 mole %: 1-49 mole % and x+y+z does not exceed 100 mole %; as exemplified by:
Polymer 18: x=10 mole %, y=50 mole %, z=40 mole %;
Polymer 19: x=20 mole %, y=50 mole %, z=30 mole %;
Polymer 20: x=30 mole %, y=50 mole %, z=20 mole %; and
Polymer 21: x=40 mole %, y=50 mole %, z=10 mole %.

EXAMPLES 22 AND 23

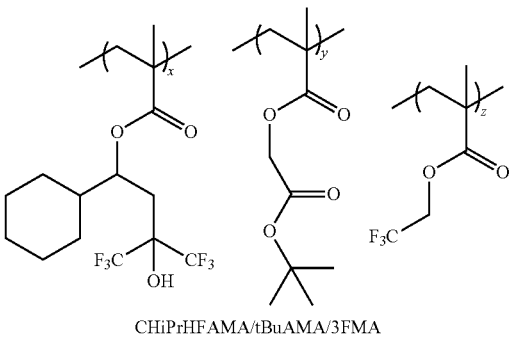

CHiPrHFAMA/tBuAMA/3FMA wherein x:y:z=1-30 mole %: 98-50 mole %: 1-49 mole % and x+y+z does not exceed 100 mole %; as exemplified by:
Polymer 22: x=10 mole %, y=70 mole %, z=20 mole %; and
Polymer 23: x=20 mole %, y=70 mole %, z=10 mole %

EXAMPLES 24 AND 25

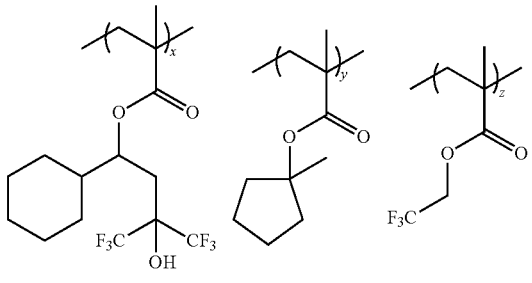

CHiPrHFAMA/MCPMA/3FMA wherein x:y:z=1-30 mole %: 98-50 mole %: 1-49 mole % and x+y+z does not exceed 100 mole %; as exemplified by:
Polymer 24: x=10 mole %, y=70 mole %, z=20 mole %; and
Polymer 25: x=20 mole %, y=70 mole %, z=10 mole %.

EXAMPLE 26

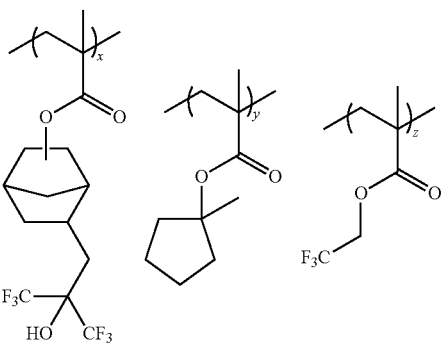

NBHFAMA/MCPMA/3FMA wherein x:y:z=1-30 mole %: 98-50 mole %: 1-49 mole % and x+y+z does not exceed 100 mole %; as exemplified by:
Polymer 26: x=10 mole %, y=70 mole %, z=20 mole %.

EXAMPLE 27

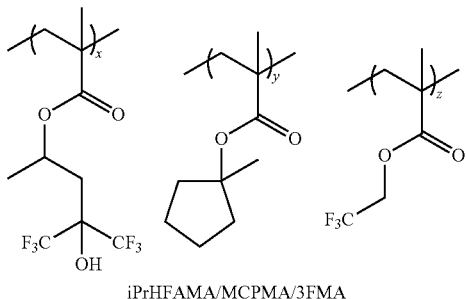

iPrHFAMA/MCPMA/3FMA wherein x:y:z=1-30 mole %: 98-50 mole %: 1-49 mole % and x+y+z does not exceed 100 mole %; as exemplified by:
Polymer 27: x=10 mole %, y=70 mole %, z 20 mole %;

EXAMPLES 28 AND 29

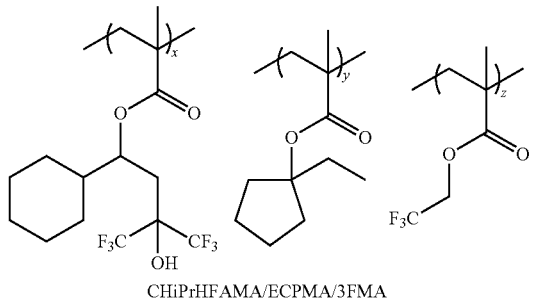

CHiPrHFAMA/ECPMA/3FMA wherein x:y:z=1-30 mole %: 98-50 mole %: 1-49 mole % and x+y+z does not exceed 100 mole %; as exemplified by:
Polymer 28: x=10 mole %, y=70 mole %, z=20 mole %;
Polymer 29: x=20 mole %, y=70 mole %, z=10 mole %;

EXAMPLE 30

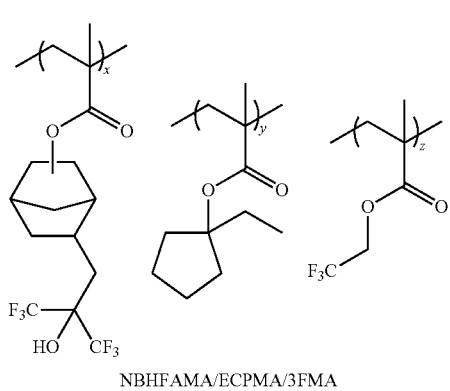

NBHFAMA/ECPMA/3FMA wherein x:y:z=1-30 mole %: 98-50 mole %: 1-49 mole % and x+y+z does not exceed 100 mole %; as exemplified by:
Polymer 30: x=10 mole %, y=70 mole %, z 20 mole %.

EXAMPLE 31

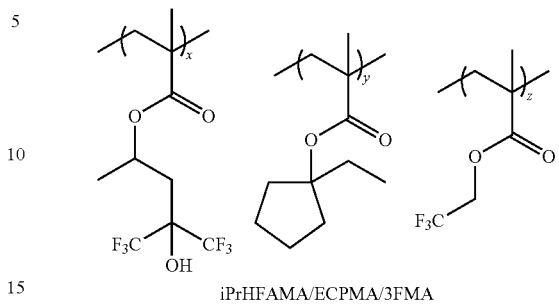

iPrHFAMA/ECPMA/3FMA wherein x:y:z=1-30 mole %: 98-50 mole %: 1-49 mole % and x+y+z does not exceed 100 mole %; as exemplified by:
Polymer 31: x=10 mole %, y=70 mole %, z=20 mole %.

The photoresist additive polymers of this invention may be used in combination with any desired photoresist formulation in the forming of a lithographic structure. Advantageously, the photoresist formulation is a chemical amplification photoresist that is sensitive to shorter wavelength ultraviolet radiation (e.g., <200 nm wavelength) or to extreme ultraviolet radiation (EUV) or electron beam radiation. Examples of suitable chemically amplified photoresists are described in H. Ito, "Chemical Amplification Resists for Microlithography," Advances in Polymer Science, Vol. 172, pp. 37-245, 2005.

The photoresist polymer or oligomer in the photoresist formulation can represent up to about 99 percent by weight of the solids included in the formulation, and the photoacid generator can represent between about 0.1 percent by weight and about 25 percent by weight of the solids contained in the photoresist formulation.

Typical polymers and oligomers used in photoresist formulations include acrylates, methacrylates, cycloolefin polymers, cycloolefin maleic anhydride copolymers, cycloolefin vinyl ether copolymers, siloxanes, silsesquioxanes, and carbosilanes. The oligomers include polyhedral oligomeric silsesquioxanes, carbohydrates, and other cage compounds. These polymers or oligomers are appropriately functionalized with aqueous base soluble groups, acid-labile groups, polar functionalities, and silicon containing groups as needed.

The photoacid generator may be any compound that, upon exposure to radiation, generates a strong acid and is compatible with the other components of the photoresist formulation. Examples of photochemical acid generators (PAGs) include, but are not limited to, sulfonates, onium salts, aromatic diazonium salts, sulfonium salts, diaryliodonium salts and sulfonic acid esters of N-hydroxyamides or N-hydroxyimides, as disclosed in U.S. Pat. No. 4,731,605. Any PAG(s) incorporated into the present photoresists should have high thermal stability, i.e., be stable to at least 140° C., so they are not degraded during pre-exposure processing.

Any suitable photoacid generator can be used in the photoresist formulations of the invention. Typical photoacid generators include, without limitation:

(1) sulfonium salts, such as triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium perfluorooctane sulfonate, diphenylethylsulfonium chloride, and phenacyldimethylsulfonium chloride;

(2) halonium salts, particularly iodonium salts, including diphenyliodonium perfluoromethanesulfonate (diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoroarsenate, bis-(t-butylphenyl)iodonium triflate, and bis-(t-butylphenyl)-iodonium camphanylsulfonate;

(3) α,α'-bis-sulfonyl-diazomethanes such as bis(p-toluenesulfonyl)diazomethane, methylsulfonyl p-toluenesulfonyldiazomethane, 1-cyclohexylsulfonyl-1-(1,1-dimethylethylsulfonyl)diazomethane, and bis(cyclohexylsulfonyl) diazomethane;

(4) trifluoromethanesulfonate esters of imides and hydroxyimides, e.g., α-(trifluoromethylsulfonyloxy)-bicyclo[2.2.1]hept-5-ene-2,3-dicarboximide (MDT);

(5) nitrobenzyl sulfonate esters such as 2-nitrobenzyl p-toluenesulfonate, 2,6-dinitrobenzyl p-toluenesulfonate, and 2,4-dinitrobenzyl p-trifluoromethylbenzene sulfonate;

(6) sulfonyloxynaphthalimides such as N-camphorsulfonyloxynaphthalimide and N-pentafluorophenylsulfonyloxynaphthalimide;

(7) pyrogallol derivatives (e.g., trimesylate of pyrogallol);

(8) naphthoquinone-4-diazides;

(9) alkyl disulfones;

(10) s-triazine derivatives, as described in U.S. Pat. No. 4,189,323; and

(11) miscellaneous sulfonic acid generators including t-butylphenyl-α-(p-toluenesulfonyloxy)-acetate, t-butyl-α-(p-toluenesulfonyloxy)acetate, and N-hydroxy-naphthalimide dodecane sulfonate (DDSN), and benzoin tosylate.

Other suitable photoacid generators are disclosed in Reichmanis et al. (1991), *Chemistry of Materials* 3:395, and in U.S. Pat. No. 5,679,495 to Yamachika et al. Additional suitable acid generators useful in conjunction with the compositions and methods provided herein will be known to those skilled in the art and/or are described in the pertinent literature.

If necessary or desirable, the photoresist formulation (before addition of the photoresist additive polymer of the embodiments of the present invention) may include additives, such as dyes, sensitizers, additives used as stabilizers, dissolution modifying agents or dissolution inhibitors, and acid-diffusion controlling agents, basic compounds, coating aids such as surfactants or anti-foaming agents, crosslinking agents, photospeed control agents, adhesion promoters and plasticizers.

Dyes that may be used to adjust the optical density of the formulated photoresist and sensitizers that enhance the activity of photoacid generators by absorbing radiation and transferring it to the photoacid generator. Examples of dyes and sensitizers include aromatics such as functionalized benzenes, pyridines, pyrimidines, biphenylenes, indenes, naphthalenes, anthracenes, coumarins, anthraquinones, other aromatic ketones, and derivatives and analogs of any of the foregoing.

In one example, the photoresist formulation includes about 1 percent by weight to about 40 percent by weight of dissolution modifying agent or dissolution inhibitor, (before addition of the photoresist additive polymers of the embodiments of the present invention). In one example, the photoresist formulation includes about 5 percent by weight to about 30 percent by weight of dissolution modifying agent or dissolution inhibitor (before addition of the photoresist additive polymers of the embodiments of the present invention).

In one embodiment, dissolution modifying agents and inhibitors have high solubility in the photoresist formulation and in the casting solvent of the photoresist formulation and exhibit strong dissolution inhibition, have a high exposed dissolution rate, are substantially transparent at the wavelength of interest, may exhibit a moderating influence on $T_g$, strong etch resistance, and display good thermal stability (i.e., stability at temperatures of about 140° C. or greater). Suitable dissolution inhibitors include, but are not limited to, bisphenol A derivatives (e.g., wherein one or both hydroxyl moieties are converted to a t-butoxy substituent or a derivative thereof such as a t-butoxycarbonyl or t-butoxycarbonylmethyl group); fluorinated bisphenol A derivatives such as $CF_3$-bisphenol A-$OCH_2(CO)$—O-tBu (6F-bisphenol A protected with a t-butoxycarbonylmethyl group); normal or branched chain acetal groups such as 1-ethoxyethyl, 1-propoxyethyl, 1-n-butoxyethyl, 1-isobutoxy-ethyl, 1-t-butyloxyethyl, and 1-t-amyloxyethyl groups; and cyclic acetal groups such as tetrahydrofuranyl, tetrahydropyranyl, and 2-methoxytetrahydro-pyranyl groups; androstane-17-alkylcarboxylates and analogs thereof, wherein the 17-alkylcarboxylate at the 17-position is typically lower alkyl. Examples of such compounds include lower alkyl esters of cholic, ursocholic and lithocholic acid, including methyl cholate, methyl lithocholate, methyl ursocholate, t-butyl cholate, t-butyl lithocholate, t-butyl ursocholate, and the like (see, e.g., Allen et al. (1995) *J. Photopolym. Sci. Technol.*, cited supra); hydroxyl-substituted analogs of such compounds (ibid.); and androstane-17-alkylcarboxylates substituted with one to three $C_1$-$C_4$ fluoroalkyl carbonyloxy substituents, such as t-butyl trifluoroacetyllithocholate (see, e.g., U.S. Pat. No. 5,580,694 to Allen et al.).

A wide variety of compounds with varying basicity may be used as stabilizers and acid-diffusion controlling additives. They may include nitrogenous compounds such as aliphatic primary, secondary, and tertiary amines, cyclic amines such as piperidines, pyrimidines, morpholines, aromatic heterocycles such as pyridines, pyrimidines, purines, imines such as diazabicycloundecene, guanidines, imides, amides, and others. Ammonium salts may also be used, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed Surfactants may be used to improve coating uniformity, and include a wide variety of ionic and non-ionic, monomeric, oligomeric, and polymeric species.

A wide variety of anti-foaming agents may be employed to suppress coating defects.

Adhesion promoters may be used as well; again, a wide variety of compounds may be employed to serve this function.

A wide variety of monomeric, oligomeric, and polymeric plasticizers such as oligo- and polyethyleneglycol ethers, cycloaliphatic esters, and non-acid reactive steroidally derived materials may be used as plasticizers, if desired.

However, neither the classes of compounds nor the specific compounds mentioned above are intended to be comprehensive and/or limiting.

One skilled in the art will recognize the wide spectrum of commercially available products that may be used to carry out the types of functions that these additives described supra perform.

In one example, the sum of all additives of the photoresist formulation (before addition of the photoresist additive polymers of the embodiments of the present invention) will comprise less than 20 percent by weight of the solids included in the photoresist formulation. In one example, the sum of all additives of the photoresist formulation (before addition of the photoresist additive polymers of the embodiments of the present invention) will comprise less than 5 percent by weight photoresist formulation.

The remainder of the photoresist formulation is composed of a casting solvent. The choice of casting solvent is governed by many factors not limited to the solubility and miscibility of photoresist components, the coating process, and safety and environmental regulations. Additionally, inertness to other photoresist components is desirable. In one embodiment, the casting solvent may possess the appropriate volatility to allow uniform coating of films yet also allow significant reduction or complete removal of residual solvent during the post-application bake process. See, e.g., *Introduction to Microlithography*, Eds. Thompson et al., cited previously. Where the photoresist formulation is used in a multilayer imaging process, the casting solvent used in the imaging layer photoresist is preferably not a solvent to the underlayer materials, otherwise the unwanted intermixing may occur. The invention is not limited to selection of any particular casting solvent. Suitable casting solvents may generally be chosen from ether-, ester-, hydroxyl-, and ketone-containing compounds, or mixtures of these compounds. Examples of appropriate solvents include carbon dioxide, cyclopentanone, cyclohexanone, ethyl 3-ethoxypropionate (EEP), a combination of EEP and γ-butyrolactone (GBL), lactate esters such as ethyl lactate, alkylene glycol alkyl ether esters such as PGMEA, alkylene glycol monoalkyl esters such as methyl cellosolve, butyl acetate, and 2-ethoxyethanol. In one embodiment, solvents include ethyl lactate, propylene glycol methyl ether acetate, ethyl 3-ethoxypropionate and their mixtures. The above list of casting solvents is for illustrative purposes only and should not be viewed as being comprehensive nor should the choice of solvent be viewed as limiting the invention in any way. Those skilled in the art will recognize that any number of solvents or solvent mixtures may be used as casting solvents.

In one example, greater than about 50 percent of the total weight of the photoresist formulation (before addition of the photoresist additive polymers of the embodiments of the present invention) comprises casting solvent. In one example, greater than about 80 percent of the total weight of the photoresist formulation (before addition of the photoresist additive polymers of the embodiments of the present invention) comprises casting solvent.

Another aspect of the invention relates to an method of fabricating an electronic device using photoresist formulations to which one or more of the photoresist additive polymers of examples 14 through 31 has been added in a process including:

(1) forming a material layer on a top surface of a substrate;
(2) coating the material layer with a photoresist formulation containing the photoresist additives of the embodiments of the present invention to form a photoresist layer;
(3) performing an optional pre-exposure bake (heating the photoresist layer to a temperature greater than room temperature) to remove casting solvents from the photoresist layer;
(4) immersing the photoresist layer in an immersion fluid (e.g., water or air);
(5) exposing the immersed photoresist layer to actinic radiation through a patterned photomask to formed exposed regions in the photoresist layer;
(6) performing an optional post-exposure bake (heating the photoresist layer to a temperature greater than room temperature);
(7) developing the exposed photoresist layer in an aqueous alkaline solution to generate a patterned photoresist layer to transfer the photomask pattern to the photoresist layer (e.g., either to remove the exposed regions of the photoresist layer in the case of a positive resist or to remove the unexposed regions of the photoresist layer in the case of a negative photoresist);
(8) either transferring (e.g., etching) the photoresist pattern to the material layer or performing an ion implantation into the material layer where the material layer is not covered by photoresist; and
(9) removing the photoresist layer.

The present invention, as mentioned above, is also directed to photoresist additive polymers of examples 14 through 31, which have a low surface energy, i.e., high water contact angle. The structures presented above have been characterized for static, advancing and receding water contact angles as described infra.

However, in order to evaluate the photoresist additive polymers of embodiments of the present invention and photoresist formulations containing photoresist polymers additives of the embodiments of the present invention, the mono-polymer and copolymers 1 though 13 (described infra) were prepared as controls for the evaluations.

EXAMPLES 1 AND 2

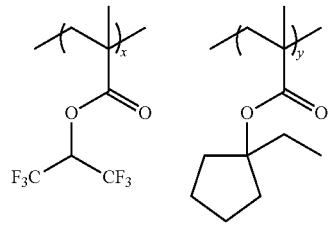

HFIPMA/ECPMA

Polymer 1: x=50 mole %, y=50 mole %; and
Polymer 2: x=30 mole %, y=70 mole %.

EXAMPLES 3

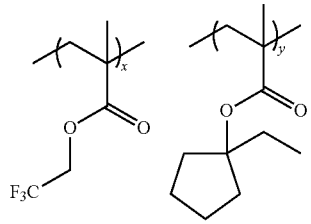

3FMA/ECPMA

Polymer 3 x=30 mole %, y=70 mole %.

EXAMPLE 4
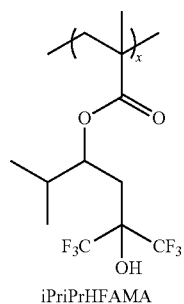
iPriPrHFAMA
Polymer 4 x=100 mole %;
EXAMPLE 5
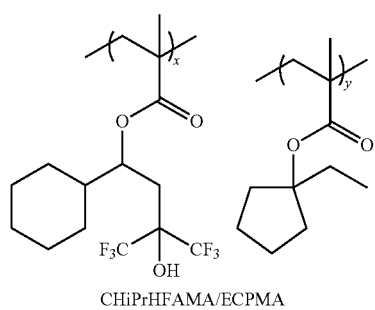
CHiPrHFAMA/ECPMA
Polymer 5: x=50 mole %, y=50 mole %;
EXAMPLE 6
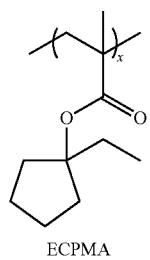
ECPMA
Polymer 6: x=100 mole %.
EXAMPLE 7
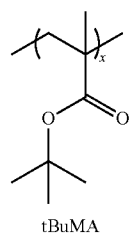
tBuMA
Polymer 7: x=100 mole %.
EXAMPLE 8
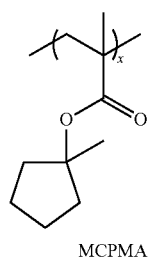
MCPMA
Polymer 8: x=100 mole %.
EXAMPLE 9
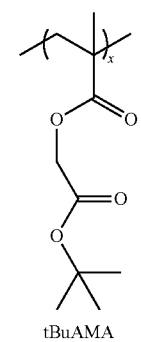
tBuAMA
Polymer 9: x=100 mole %;
EXAMPLE 10
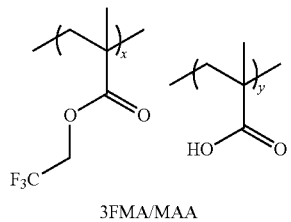
3FMA/MAA
Polymer 10: x=70 mole %, y=30 mole %.
EXAMPLE 11
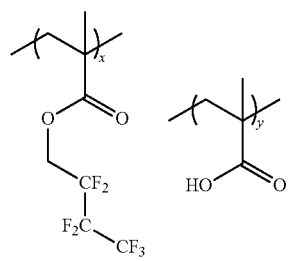
F7BuMA/MAA
Polymer 11: x=70 mole %, y=30 mole %.

EXAMPLE 12

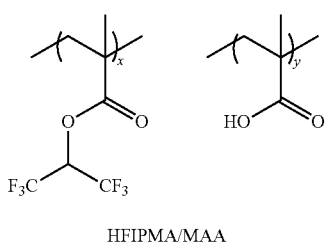

HFIPMA/MAA

Polymer 12: x=70 mole %, y=30 mole %

EXAMPLE 13

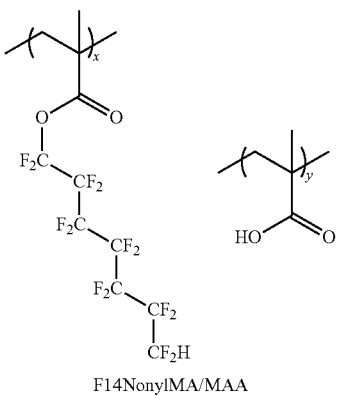

F14NonylMA/MAA

Polymer 13: x=70 mole %, y=30 mole %.

Preparation Examples

The following examples are intended to provide those of ordinary skill in the art with a complete disclosure and description of how to prepare and use the compositions disclosed and claimed herein. Efforts have been made to ensure accuracy with respect to measured numbers, but allowance should be made for the possibility of errors and deviations. Unless indicated otherwise, parts are parts by weight, temperature is in ° C. and pressure is at or near atmospheric. 1-Cyclohexyl-4,4,4-trifluoro-3-hydroxy-3-(trifluoromethyl) butyl methacrylate and 5/6-(3,3,3-trifluoro-2-hydroxy-2-(trifluoromethyl)propyl)bicyclo[2.2.1]heptan-2-yl methacrylate were obtained from Central Glass (Japan). Additionally, all the other starting materials were obtained commercially or were synthesized using known procedures.

Synthesis of Polymers 1 and 2: Poly(1,1,1,3,3,3-hexafluoroisopropyl methacrylate-co-1-ethyl-cyclopentyl methacrylate) (HFIPMA/ECPMA):

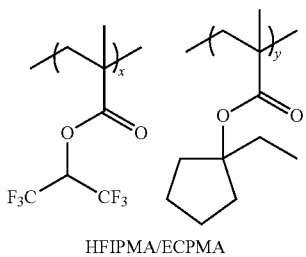

HFIPMA/ECPMA

Polymer 1: x=50 mole %, y=50 mole % and Polymer 2: x=30 mole %, y=70 mole %.

Polymer 1: 1,1,1,3,3,3-hexafluoroisopropyl methacrylate (2.00 grams, 0.0085 mole), 1-ethyl-cyclopentyl methacrylate (1.54 grams, 0.0085 mole) and 1 gram of tetrahydrofuran (THF) were placed in a round bottom flask equipped with a condenser and a nitrogen inlet. 2,2'-Azobisisobutyronitrile (AIBN) (0.112 grams, 0.00068 moles) and 1-dodecanethiol (0.103 grams, 0.00051 moles) were added to this solution and stirred until dissolved. The solution was then degassed using four vacuum/nitrogen purges. The contents were then heated to reflux for 18 hours. Afterwards, the solution was added dropwise into 500 mL of 4:1 water/isopropanol. The precipitated polymer was separated by decantation, rinsed with 2×50 milliliters of DI water, and dried under vacuum at 60° C. Yield: 2.61 grams. $M_n$=2958. Polydispersity 1.67. Tg: 34° C.

Synthesis of Polymers 3-31: These polymers were synthesized by the same procedure described for Polymer 1, starting with appropriate monomers in required quantities. Isolation was performed by precipitation into hexanes or methanol when possible.

Where appropriate, the following techniques and equipment were utilized in the evaluation of example polymers: $^1$H and $^{13}$C NMR spectra were obtained at room temperature on an Avance 400 spectrometer. Quantitative $^{13}$C NMR was run at room temperature in acetone-d6 in an inverse-gated $^1$H-decoupled mode using Cr(acac)3 as a relaxation agent on an Avance 400 spectrometer. For polymer composition analysis 19F NMR (379 MHz) spectra were also obtained using a Bruker Avance 400 spectrometer. Thermo-gravimetric analysis (TGA) was performed at a heating rate of 5° C./min in $N_2$ on a TA Instrument Hi-Res TGA 2950 Thermogravimetric Analyzer. Differential scanning calorimetry (DSC) was performed at a heating rate of 10° C./min on a TA Instruments DSC 2920 modulated differential scanning calorimeter. Molecular weights were measured in tetrahydrofuran (THF) on a Waters Model 150 chromatograph relative to polystyrene standards. IR spectra were recorded on a Nicolet 510 FT-IR spectrometer on a film cast on a KBr plate. Optical density or absorbance measurements at 193 nm were performed using a Varian Cary Model 400 spectrometer on multiple thicknesses on quartz wafers. Film thickness was measured on a Tencor alpha-step 2000 or Nanospec. A quartz crystal microbalance (QCM) with a MAXTEC Inc. PLO-10 Phase lock oscillator was used to study the dissolution kinetics of the photoresist layers in an aqueous 0.26N tetramethylammonium hydroxide (TMAH) solution (CD-26). Lithographic evaluation was performed on a 0.6N 193 nm mini-stepper, dry exposure tool or a 193 nm interferometric exposure tool.

A water contact angle is measured using a drop of water on a top surface of a photoresist layer and is the angle between the tangent of the drop of water at the top surface of the photoresist layer and the plane defined by the top surface of the photoresist layer. Water contact angles were measured on an OCA video based water contact angle system from FDS Future Digital Scientific Corporation, using the sessile drop method. Advancing and receding water contact angles can be measured using two different techniques, tilting stage and captive drop. Advancing and receding water contact angles measured with the captive drop setup (also called dynamic water contact angles) are measured when the three phase line is in controlled motion by wetting the sample or by withdrawing the water over a pre-wetted surface, respectively.

FIG. 1A shows the static water contact angle $\theta_{static}$ to be the angle when all participating phases (i.e., air, water and photoresist layer) have reached their natural equilibrium positions and the three phase line is not moving. The static water contact is measured using a 2 μL ionized water drop.

Figure 1B:
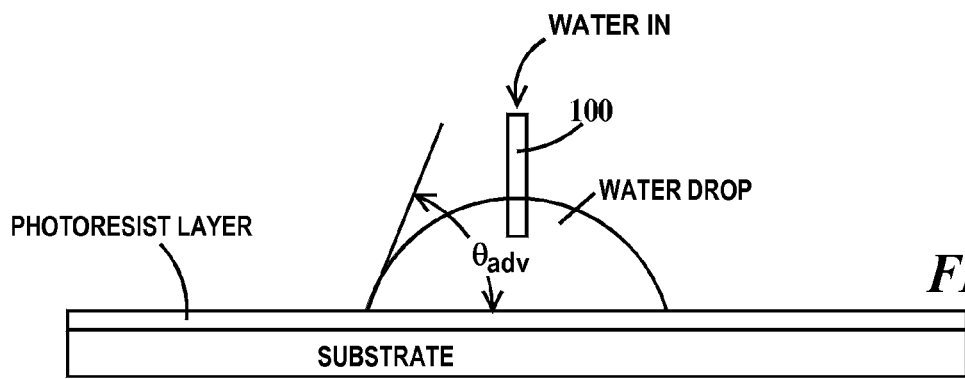
FIG. 1B and FIG. 1C show how the reported dynamic water contact angles using the captive drop technique are calculated.
Figure 1C:
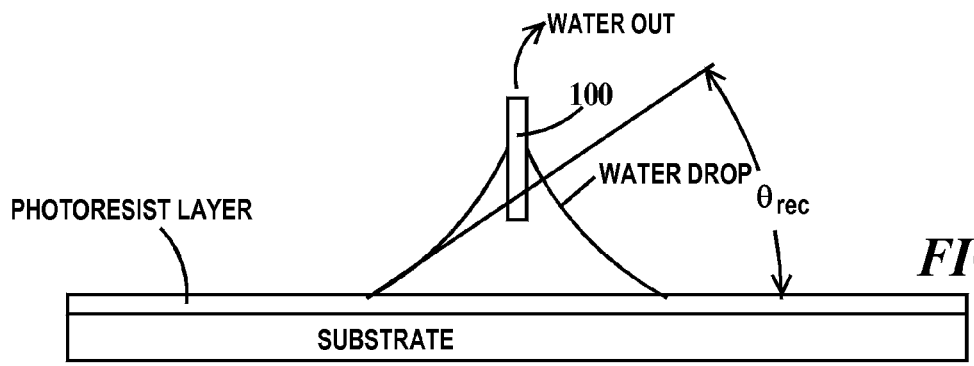

FIG. 1B and FIG. 1C show how dynamic water contact angles are measured with the captive drop setup. The presented numbers are calculated from an average of 3-5 measurements with needle 100 inside the droplet as it is increasing in volume ($\theta_{adv}$) and decreasing in volume ($\theta_{rec}$) (0 µL-20 µL) with a controlled rate of 0.1 µL/second, respectively.

Figure 1D:
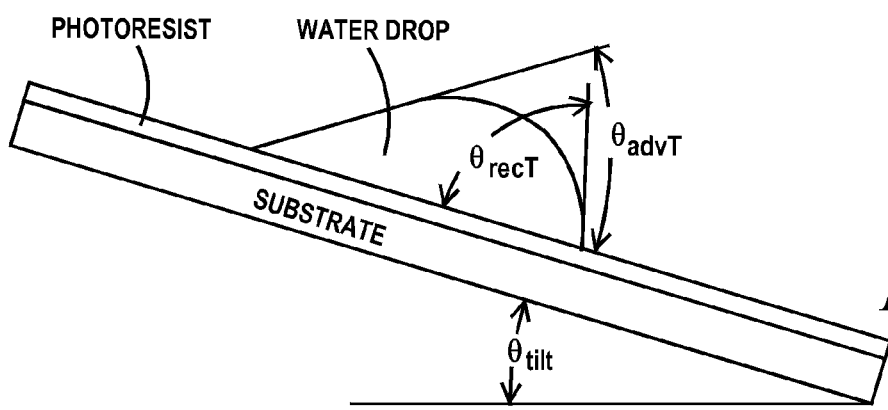
FIG. 1D shows how static, advancing and receding water contact angles are measured with the tilting stage setup.

FIG. 1D shows how a $\theta_{advT}$ and $\theta_{recT}$ water contact angles are measured with the tilting stage setup. A 50 µl drop is placed on the substrate, the substrate is thereafter tilted until the droplet starts moving. The $\theta_{tilt}$, $\theta_{adv,T}$ and $\theta_{rec,T}$ are measured just before the drop starts moving.

covered by the present invention as compared to without using an additive. In all cases, the extractables were much lower after the addition of a photoresist additive polymer according to the embodiments of the present invention was added to the photoresist formulation.

Control polymer additives 1 to 13 and photoresist additive polymers 14-31 in Table 1 were dissolved in 4-methyl-2-pentanol (to a 5% by weight solids solution) and spun onto silicon wafers. The wafers were baked at 90° C. for 60 seconds to remove residual casting solvent. The resultant coatings were then subjected to water contact angle analysis and the results are shown in Table 1.

TABLE 1

Properties of photoresist additive compounds.

| Example | Additive | Composition | $M_n$ | PDI | $\theta_{static}$ | $\theta_{adv.}$ | $\theta_{rec.}$ | $\theta_{tilt.}$ |
|---|---|---|---|---|---|---|---|---|
| 1 | HFIPMA/ECPMA | 50:50 | 2958 | 1.67 | | | | |
| 2 | HFIPMA/ECPMA | 30:70 | 2461 | 1.73 | | | | |
| 3 | 3FMA/ECPMA | 30:70 | 5855 | 1.41 | 90.1 | 91.2 | 74.7 | 16.2 |
| 4 | iPriPrHFAMA | 100 | 6924 | 1.34 | 93.2 | 93.3 | 79.6 | 12.4 |
| 5 | CHiPrHFAMA/ECPMA | 50:50 | 3285 | 1.52 | 94.6 | 93.9 | 78.1 | 13.9 |
| 6 | ECPMA | 100 | 3259 | 1.67 | 88.2 | 87.2 | 74.8 | 12.2 |
| 7 | tBuMA | 100 | 8922 | 1.53 | 85.9 | 84.8 | 74.5 | 10.2 |
| 8 | MCPMA | 100 | 8445 | 2.07 | 83.4 | 82.8 | 73.3 | 9.7 |
| 9 | tBuAMA | 100 | 8842 | 1.37 | 80.7 | 81.8 | 67.3 | 12.6 |
| 10 | 3FMA/MAA | 70:30 | 10524 | 2.16 | | | | |
| 11 | F7BuMA/MAA | 70:30 | 7375 | 1.29 | | | | |
| 12 | HFIPMA/MAA | 70:30 | 4977 | 1.60 | | | | |
| 13 | F14NonylMA/MAA | 70:30 | 7212 | 1.36 | | | | |
| 14 | iPrHFAMA/ECPMA/HFIPMA | 5:50:45 | 3577 | 1.63 | | | | |
| 15 | iPrHFAMA/ECPMA/HFIPMA | 10:50:40 | 3651 | 1.61 | | | | |
| 16 | iPrHFAMA/ECPMA/HFIPMA | 20:50:30 | 3988 | 1.44 | | | | |
| 17 | iPrHFAMA/ECPMA/HFIPMA | 30:50:20 | 4188 | 1.40 | | | | |
| 18 | CHiPrHFAMA/ECPMA/HFIPMA | 10:50:40 | 3108 | 1.47 | | | | |
| 19 | CHiPrHFAMA/ECPMA/HFIPMA | 20:50:30 | 3196 | 1.47 | | | | |
| 20 | CHiPrHFAMA/ECPMA/HFIPMA | 30:50:20 | 3739 | 1.40 | 96.7 | 96.3 | 79.1 | 14.8 |
| 21 | CHiPrHFAMA/ECPMA/HFIPMA | 40:50:10 | 3585 | 1.40 | 95.7 | 94.4 | 78.1 | 14.1 |
| 22 | CHiPrHFAMA/tBuAMA/3FMA | 10:70:20 | 9549 | 1.36 | 88.6 | 89.5 | 69.6 | 17.7 |
| 23 | CHiPrHFAMA/tBuAMA/3FMA | 20:70:10 | 11194 | 1.28 | 89.7 | 89.0 | 72.5 | 17.0 |
| 24 | CHiPrHFAMA/MCPMA/3FMA | 10:70:20 | 3698 | 1.66 | 91.2 | 90.9 | 73.2 | 17.1 |
| 25 | CHiPrHFAMA/MCPMA/3FMA | 20:70:10 | 4738 | 1.50 | 92.2 | 91.7 | 74.2 | 16.7 |
| 26 | NBHFAMA/MCPMA/3FMA | 10:70:20 | 3748 | 1.65 | 89.0 | 89.0 | 70.4 | 17.7 |
| 27 | iPrHFAMA/MCPMA/3FMA | 10:70:20 | 3402 | 1.64 | 89.2 | 89.3 | 68.7 | 20.2 |
| 28 | CHiPrHFAMA/ECPMA/3FMA | 10:70:20 | 4459 | 1.60 | 92.2 | 91.6 | 73.8 | 17.2 |
| 29 | CHiPrHFAMA/ECPMA/3FMA | 20:70:10 | 4403 | 1.46 | 93.4 | 92.2 | 75.4 | 15.9 |
| 30 | NBHFAMA/ECPMA/3FMA | 10:70:20 | 2733 | 1.68 | 90.1 | 89.6 | 71.5 | 17.8 |
| 31 | iPrHFAMA/ECPMA/3FMA | 10:70:20 | 2884 | 1.62 | 89.7 | 89.6 | 68.6 | 19.4 |

Unless otherwise noted, all water contact angles presented infra were measured using the tilting stage technique. In various studies described infra, the static water contact angle ($\theta_{static}$), advancing water contact angle ($\theta_{adv}$), receding water contact angle ($\theta_{rec}$), and tilt angle ($\theta_{tilt}$) if applicable, are reported. The static water contact angles presented infra are an average of 5-10 measurements. The advancing and receding water contact angles presented infra are calculated from and average of 3-5 separate measurements.

One of the objectives of the embodiments of the present invention is to prevent leaching of extractables from the photoresist into the immersion liquid. Extraction of photoresist components into water was performed using WEXA (Water Extraction Apparatus, see R. D. Allen et. al., *J. Photopolym. Sci. & Tech.*, 2005, 18 (5), 615-619). Selected materials in the present invention were set in contact with water in a controlled reproducible manner (time, speed, volume, contact area etc.). The water was thereafter collected and analyzed for extractables by Exygen Research using LC/MS/MS. Reported is the amount sulfonate extractables originating from the PAG (photo acid generator) that is a component of the photoresist. For ease of understanding, the amount is reported as percent extractable reduction using an additive Control polymer additives/photoresist formulation mixtures 32-40 and photoresist additive polymers/photoresist formulation mixtures 41-58 were formulated by adding solutions of the additive in PGMEA (10% by weight solids) to AR1682J (a commercial photoresist formulation) until 5% by weight additive is achieved relative to the solids content in AR1682J. The amount of photoresist additive polymer according to the embodiments of the present invention added to the photoresist formulation can be from about 0.1% by weight to about 10% by weight of the total solids content of the photoresist formulation (before addition of the photoresist additive polymer according to the embodiments of the present invention) in the mixture, although best performance is usually observed with a photoresist additive polymer loading of about 2% by weight to about 5% by weight of the total solids in the photoresist formulation (before addition of the photoresist additive polymer according to the embodiments of the present invention). The photoresist/additive mixtures were spin applied (3000 rpm, 30 seconds) onto silicon wafers (with or without a pre-applied bottom anti-reflective coating) and, subsequently, baked at 110° C. for 90 seconds. The photoresist coated wafers were then subjected to water contact angle analysis using deionized water and 0.26 N aqueous tetramethylammonium hydroxide (Air Products) and the results shown in Table 2.

TABLE 2

Water and TMAH developer contact angles of JSR AR1682J with additive.

| | | | Water | | | | 0.26 N TMAH | | | |
| --- | --- | --- | --- | --- | --- | --- | --- | --- | --- | --- |
| Example | Additive | Composition | $\theta_{static}$ | $\theta_{adv.}$ | $\theta_{rec.}$ | $\theta_{tilt.}$ | $\theta_{static}$ | $\theta_{adv.}$ | $\theta_{rec.}$ | $\theta_{tilt.}$ |
| 32 | HFIPMA/ECPMA | 50:50 | 101.8° | 101.4° | 83.6° | 16.5° | 101.4° | 99.0° | 74.7° | 21.2° |
| 33 | HFIPMA/ECPMA | 30:70 | — | 100.2° | 82.5° | 15.5° | — | 100.2° | 73.4° | 23.3° |
| 34 | 3FMA/ECPMA | 30:70 | 91.1° | 91.0° | 75.3° | 15.0° | 78.5° | 76.5° | 63.1° | 7.9° |
| 35 | iPriPrHFAMA | 100 | 92.8° | 93.7° | 78.7° | 12.8° | — | 78.2° | 33.1° | 40.0° |
| 36 | CHiPrHFAMA/ECPMA | 50:50 | 94.6° | 93.4° | 79.7° | 12.0° | 83.5° | 83.6° | 51.3° | 29.6° |
| 37 | 3FMA/MAA | 30:70 | 83.7°* | 95.7°* | 57.5°* | — | — | — | — | — |
| 38 | F7BuMA/MAA | 30:70 | 101.9°* | 110.1°* | 60.0°* | — | — | — | — | — |
| 39 | HFIPMA/MAA | 30:70 | 99.7°* | 108.5°* | 62.7°* | — | — | — | — | — |
| 40 | F14NonylMA/MAA | 30:70 | 100.1°* | 103.8°* | 65.0°* | — | — | — | — | — |
| 41 | iPrHFAMA/ECPMA/HFIPMA | 5:50:45 | 101.1° | 100.6° | 82.3° | 16.7° | 97.5° | 97.5° | 69.4° | 24.7° |
| 42 | iPrHFAMA/ECPMA/HFIPMA | 10:50:40 | 99.5° | 98.4° | 81.1° | 17.2° | 93.5° | 94.1° | 63.8° | 27.0° |
| 43 | iPrHFAMA/ECPMA/HFIPMA | 20:50:30 | 95.9° | 96.2° | 73.5° | 20.6° | 88.2° | 90.7° | 31.8° | 55.0° |
| 44 | iPrHFAMA/ECPMA/HFIPMA | 30:50:20 | 87.6° | 93.5° | 63.6° | 28.1° | 84.9° | 86.5° | 15.5° | 61.9° |
| 45 | CHiPrHFAMA/ECPMA/HFIPMA | 10:50:40 | 99.7° | 100.4° | 82.5° | 16.3° | 94.5° | 97.3° | 66.7° | 27.2° |
| 46 | CHiPrHFAMA/ECPMA/HFIPMA | 20:50:30 | 98.1° | 98.8° | 81.6° | 15.7° | 91.1° | 94.4° | 61.6° | 30.5° |
| 47 | CHiPrHFAMA/ECPMA/HFIPMA | 30:50:20 | 96.7° | 95.9° | 79.7° | 13.5° | 87.4° | 89.2° | 55.2° | 33.3° |
| 48 | CHiPrHFAMA/ECPMA/HFIPMA | 40:50:10 | 95.1° | 94.4° | 79.9° | 13.2° | 85.6° | 87.0° | 53.4° | 31.0° |
| 49 | CHiPrHFAMA/tBuAMA/3FMA | 10:70:20 | 89.3° | 89.8° | 70.5° | 17.3° | 81.2° | 83.6° | 56.0° | 25.7° |
| 50 | CHiPrHFAMA/tBuAMA/3FMA | 20:70:10 | 90.4° | 89.5° | 73.3° | 18.0° | 81.4° | 82.5° | 50.2° | 30.1° |
| 51 | CHiPrHFAMA/MCPMA/3FMA | 10:70:20 | 90.4° | 89.2° | 74.1° | 14.9° | 71.7° | 74.9° | 43.8° | 17.8° |
| 52 | CHiPrHFAMA/MCPMA/3FMA | 20:70:10 | 91.7° | 91.1° | 75.6° | 14.7° | 83.0° | 83.4° | 52.4° | 28.5° |
| 53 | NBHFAMA/MCPMA/3FMA | 10:70:20 | 87.5° | 87.1° | 70.5° | 15.2° | 71.1° | 74.5° | 43.5° | 17.2° |
| 54 | iPrHFAMA/MCPMA/3FMA | 10:70:20 | 87.5° | 88.6° | 69.3° | 18.7° | 69.2° | 73.2° | 11.7° | 30.8° |
| 55 | CHiPrHFAMA/ECPMA/3FMA | 10:70:20 | 91.7° | 90.9° | 75.1° | 15.4° | 72.9° | 73.6° | 36.9° | 21.5° |
| 56 | CHiPrHFAMA/ECPMA/3FMA | 20:70:10 | 93.3° | 92.5° | 77.5° | 14.4° | 83.7° | 84.3° | 44.1° | 36.7° |
| 57 | NBHFAMA/ECPMA/3FMA | 10:70:20 | 88.5° | 88.9° | 71.3° | 16.3° | 71.8° | 73.1° | 35.7° | 22.2° |
| 58 | iPrHFAMA/ECPMA/3FMA | 10:70:20 | 88.8° | 89.2° | 70.8° | 18.0° | 69.9° | 73.3° | 9.7° | 31.7° |

*Measured by captive drop technique

Control polymer additives/photoresist formulation mixtures 32-36 and photoresist additive polymers/photoresist formulation mixtures 41-48, 51, 53-55 and 57-59 were spin applied (3000 rpm, 30 seconds) onto silicon wafers (with or without a pre-applied bottom anti-reflective coating) and, subsequently, baked at 110° C. for 90 seconds. The photoresist coated wafers were then subjected to controlled exposure to a volume of water using the WEXA apparatus described previously. The amount of extracted PAG was measured by LC/MS/MS and the values were normalized relative to those obtained using AR1682J without topcoat (example 59) (AR1682J without topcoat=100). The normalized results are shown in Table 3.

TABLE 3

PAG extraction of JSR AR1682J with and without 5% by weight additive

| Example | Additive | Additive Composition | Relative PAG extraction |
| --- | --- | --- | --- |
| 59 | none | — | 100 |
| 32 | HFIPMA/ECPMA | 50:50 | 0.7 |
| 33 | HFIPMA/ECPMA | 30:70 | 0.8 |
| 34 | 3FMA/ECPMA | 30:70 | — |
| 35 | iPriPrHFAMA | 100 | 21.5 |
| 36 | CHiPrHFAMA/ECPMA | 50:50 | 5.1 |
| 41 | iPrHFAMA/ECPMA/HFIPMA | 5:50:45 | 1.6 |
| 42 | iPrHFAMA/ECPMA/HFIPMA | 10:50:40 | 2.0 |
| 43 | iPrHFAMA/ECPMA/HFIPMA | 20:50:30 | 15.4 |
| 44 | iPrHFAMA/ECPMA/HFIPMA | 30:50:20 | 38.6 |
| 45 | CHiPrHFAMA/ECPMA/HFIPMA | 10:50:40 | 2.1 |
| 46 | CHiPrHFAMA/ECPMA/HFIPMA | 20:50:30 | 3.5 |
| 47 | CHiPrHFAMA/ECPMA/HFIPMA | 30:50:20 | 4.1 |
| 48 | CHiPrHFAMA/ECPMA/HFIPMA | 40:50:10 | 6.5 |
| 55 | CHiPrHFAMA/MCPMA/3FMA | 10:70:20 | 6.1 |
| 57 | NBHFAMA/MCPMA/3FMA | 10:70:20 | 16.0 |
| 58 | iPrHFAMA/MCPMA/3FMA | 10:70:20 | 16.3 |
| 51 | CHiPrHFAMA/ECPMA/3FMA | 10:70:20 | 15.5 |
| 53 | NBHFAMA/ECPMA/3FMA | 10:70:20 | 35.2 |
| 54 | iPrHFAMA/ECPMA/3FMA | 10:70:20 | 27.8 |

Control polymer additives/photoresist formulation mixtures 61-63 and photoresist additive polymers/photoresist formulation mixtures 64-67 were formulated by adding solution of the additive (10% by weight solids) to AR2863JN (a commercial photoresist formulation) until about 5% by weight of the total solids of the mixture was additive. Photoresist mixtures 60-67 were spun onto silicon wafers with a pre-applied bottom anti-reflective coating (77 nm of ARC29A, Brewer Science). Subsequently, the wafers were baked at 100° C. for 60 seconds resulting in photoresist thicknesses of about 120 nm. In example 60b, a topcoat (JSR TCX-041) was additionally cast onto the photoresist and baked at 90° C. for 60 seconds. One set of wafers was subjected to water contact angle analysis and PAG extraction measurements. Another set of wafers was then subjected to 193 nm water immersion lithography using an ASML XT1250i immersion scanner (NA=0.85, annular illumination, annulus dimensions=outer/inner=0.89/0.59) at a scan rate of 500 mm/s. Line-space patterns (1:1, 100 nm half-pitch) were imaged using an attenuated phase-shifting mask. After exposure, the wafers were baked at 130° C. for 60 seconds, cooled, and then developed with 0.26 N aqueous tetramethylammonium hydroxide (60 seconds, no surfactant, LD-nozzle). Inspection was performed by a KLA-2351 UV inspection tool (mode: random, imaging mode: bright, pixel size: 0.16 µm, threshold mode: auto, threshold: 15, coverage: 50%). Defect regions were subsequently analyzed by a scanning electron microscope to image and classify the defect as immersion-related (watermark, bubble defects . . . etc.) or non-immersion related (large particles . . . etc.). The results are shown in Table 4.

example 40 v. example 38). Although the 2,2,2-trifluoroethyl methacrylate (3FMA) monomer is employed in many of the following examples due to its ready availability and low cost, it is to be understood that many other suitable fluorinated methacrylates could be employed based on the lessons outlined here.

TABLE 4

Physical properties and immersion defectivity of JSR AR2863JN with and without additives.

| Example | Additive | Additive Composition | Water contact angles $\theta_{static}$ | $\theta_{adv.}$ | $\theta_{rec.}$ | PAG extraction [mol/cm$^2$/10 s] | Immersion-related defects watermark | bubble | others |
|---|---|---|---|---|---|---|---|---|---|
| 60a | none | — | 74.9° | 80.0° | 60.9° | $1.10 \times 10^{-11}$ | 33 | 0 | 1 |
| 60b | with TCX-041 topcoat | — | — | 92° | 69° | $1.0 \times 10^{-13}$ | 19 | 0 | 0 |
| 61 | iPriPrHFAMA | 100 | 92.7° | 99.3° | 83.7° | $4.10 \times 10^{-13}$ | 111 | 257 | 1 |
| 62 | CHiPrHFAMA/ECPMA | 50:50 | 94.6° | 98.0° | 85.7° | $1.5 \times 10^{-13}$ | 3 | 246 | 0 |
| 63 | 3FMA/ECPMA | 30:70 | 92.1° | 94.6° | 82.5° | $5.10 \times 10^{-14}$ | 0 | 0 | 2 |
| 64 | CHiPrHFAMA/ECPMA/3FMA | 10:70:20 | 91.4° | 95.2° | 82.1° | $2.91 \times 10^{-13}$ | 0 | 0 | 0 |
| 65 | CHiPrHFAMA/MCPMA/3FMA | 10:70:20 | 90.2° | 94.4° | 80.6° | $1.84 \times 10^{-13}$ | 0 | 0 | 1 |
| 66 | NBHFAMA/MCPMA/3FMA | 10:70:20 | 88.5° | 91.6° | 77.5° | $1.87 \times 10^{-11}$ | 0 | 0 | 0 |
| 67 | iPrHFAMA/MCPMA/3FMA | 10:70:20 | 88.2° | 92.5° | 76.2° | $2.83 \times 10^{-13}$ | 0 | 0 | 0 |

Example 60a (Table 4) shows high watermark defect levels, which are reduced by the application of a topcoat (example 60b). The formulations with photoresist additive polymers in examples 61 and 62 show high numbers of bubble defects while example 63 and the control examples 60a and 60b do not. Bubble defects are seen in resists with water contact angles greater than about 95°. However, examples 61 and 62 showed few/no watermarks due to their high receding water contact angles. Several ways to lower the advancing water contact angles of the photoresist additive polymers (such as 61 and 62) while maintaining high receding water contact angles are discussed infra.

To test the effect of hydrophobicity of the acid-labile protecting group screening of methacrylate homopolymers with a variety of protecting groups was performed (examples 6-9, Table 1). It was found that the advancing water contact angle increased as the hydrophobicity of the pendant group increased (t-butyl acetate<methyl cyclopentyl<t-butyl<ethyl cyclopentyl). Simple modification of the protecting groups can afford lower advancing water contact angles while maintaining sufficient receding water contact angles.

The effect of fluorocarbon moiety can be seen in examples 33 and 34 of Table 2. With similar compositions, the HFIPMA-based additive with two trifluoromethyl groups has a significantly higher advancing water contact angle than the 3FMA-based additive (which has only 1 trifluoromethyl group). Several photoresist additive polymers incorporating different fluorocarbon tails were screened (examples 37-40). As the number of fluorine atoms increase so does the advancing water contact angle. Branched and linear structures with similar fluorine content (examples 38 and 39) do not display significantly different advancing water contact angles. Clearly, single trifluoromethyl group is preferable due to its lower impact on advancing water contact angle. A small hydrofluorocarbon group is preferable over a larger, more hydrophobic hydrofluorocarbon group in accordance with the results seen for the protected methacrylate homopolymers discussed previously.

Alternatively, a single hydrogen at the terminus of the side-chain affords reduced advancing water contact angles over materials with a perfluorinated terminus of the side-chain, even if the overall fluorine content is larger (see example 40 v. example 38).

Using polymers of a fluoroalcohol-containing methacrylate, ethylcyclopentyl methacrylate (ECPMA), and hexafluoroisopropyl methacrylate (HFIPMA) and keeping the ECPMA content fixed at 50%, advancing water contact angles could be reduced by incorporating more of the fluoroalcohol monomer and less of the very hydrophobic HFIPMA. Advancing water contact angles could be decreased well below 95° by increasing the amount of the protected methacrylate and replacing HFIPMA with the less hydrophobic 3FMA (examples 22-31). Selection of an appropriate fluoroalcohol-based monomer and varying the amount of the fluoroalcohol-based monomer relative to the amount of 3FMA, allows one to tailor the additives' water contact angles as well as TMAH developer water contact angles (which are extremely sensitive to the presence of the acidic fluoroalcohol groups) (see examples 49-58 in Table 2).

Table 4 also shows the improvement seen 193 nm immersion lithographic, photoresist additive polymer/photoresist formulation mixtures 64-67. These mixtures showed no watermark or bubble defects and low PAG leaching. The high efficacy of these additives is surprising given their low fluorine content. Many additives previously explored (such as examples 1-5, Table 1) had high levels of fluorination (20-45% by weight fluorine) as it was thought such high levels of fluorination were required to enable the additives to segregate to the surface. The photoresist additive polymers of the embodiments of this invention feature much lower levels of fluorination (about 10 to about 15% by weight fluorine) and offer superior lithographic performance in terms of watermark and bubble defects.

In order to evaluate the improvement seen in dry (e.g., air) 193 nm lithography using photoresist additive polymers of the embodiments of the present invention, mixtures 63-67 and line-space patterns (90 nm, 1:1) were imaged using a 193 nm Nikon S306C scanner (0.78NA, 0.85 sigma(2/3 ann.). After exposure, the wafers were baked at 130° C. for 90 seconds, cooled, and then developed with 0.26 N aqueous tetramethylammonium hydroxide (30 seconds, no surfactant, LD-nozzle). The resulting photoresist patterns were analyzed by scanning electron microscopy and the performance characteristics listed in Table 5.

TABLE 5

Lithographic performance of JSR AR2863JN with 5% by weight additives.

| Example | Additive | Additive Composition | $E_{CD}$ [mJ/cm$^2$] | Exposure Lattitude (10% CD) | Depth of Focus (10% CD) [μm] | LWR [nm] |
|---|---|---|---|---|---|---|
| 63 | 3FMA/ECPMA | 30:70 | 34.2 | 11.55% | 0.450 | 10.0 |
| 64 | CHiPrHFAMA/ECPMA/3FMA | 10:70:20 | 34.5 | 11.64% | 0.450 | 6.4 |
| 65 | CHiPrHFAMA/MCPMA/3FMA | 10:70:20 | 34.3 | 11.72% | 0.450 | 10.1 |
| 66 | NBHFAMA/MCPMA/3FMA | 10:70:20 | 34.7 | 12.18% | 0.375 | 9.1 |
| 67 | iPrHFAMA/MCPMA/3FMA | 10:70:20 | 34.8 | 11.67% | 0.450 | 6.8 |

Compared to the formulation using an additive without fluoroalcohol (Example 63, Table 5), the formulations using fluoroalcohol-based polymer additives showed similar or better dose-to-size ($E_{CD}$), exposure lattitude, depth-of-focus, and line width roughness (LWR).

Thus, the embodiments of the present invention provide materials and methods to prevent interaction between a photoresist layer and an immersion fluid in an immersion lithography system.

It should be understood that the preceding is merely a detailed description of a number of embodiments of the present invention and that numerous changes to the disclosed embodiments can be made in accordance with the disclosure herein without departing from the spirit or scope of the invention. The preceding description, therefore, is not meant to limit the scope of the invention in any respect. Rather, the scope of the invention is to be determined only by the issued claims and their equivalents.

What is claimed:

1. A polymer, comprising repeat units with the following formulae:

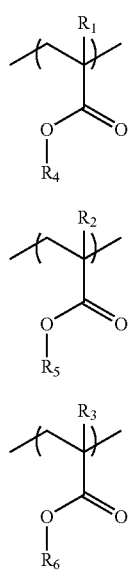

wherein:
R$_1$, R$_2$, and R$_3$ are independently hydrogen, fluorine, alkyl, or fluoroalkyl;
R$_4$ is (i) a linear, branched, or cyclic alkylene containing one or more fluoroalcohol groups that are unprotected or partially or fully protected with an acid-labile group, or (ii) a linear, branched or cyclic heteroalkylene containing one or more fluoroalcohol groups that are unprotected or partially or fully protected with an acid-labile group;
R$_5$ is (i) a hydrogen or linear, branched, or cyclic alkylene group that is acid-labile, or (ii) a linear, branched or cyclic heteroalkylene group that is acid-labile, or (iii) a linear, branched, or cyclic alkylene group containing one or more carboxylic acid, sulfonamide, fluoroalcohol, or sulfonic acid moieties, that are unprotected or partially or fully protected with an acid-labile group, or (iv) a linear, branched or cyclic heteroalkylene group containing one or more carboxylic acid, sulfonamide, fluoroalcohol, or sulfonic acid moieties, that are unprotected or partially or fully protected with an acid-labile group;
R$_6$ is a partially fluorinated or perfluorinated group, other than a fluorinated ether, that is acid-labile or non-acid labile; and
wherein M1, M2 and M3 have the respective structures:

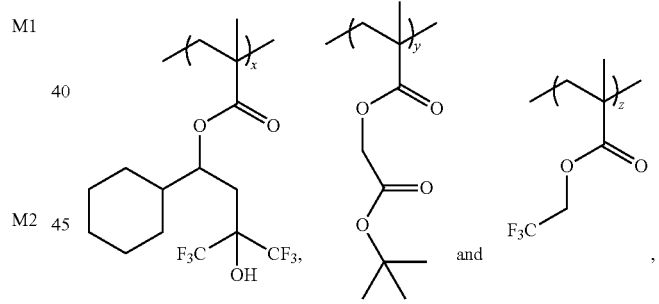

wherein x:y:z=1-30 mole %: 98-50 mole %: 1-49 mole % and x+y+z does not exceed 100 mole %; or

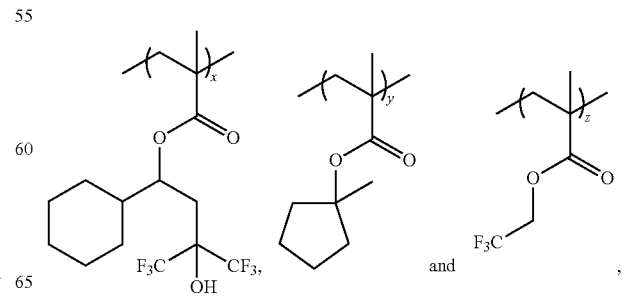

wherein x:y:z=1-30 mole %: 98-50 mole %: 1-49 mole % and x+y+z does not exceed 100 mole %; or

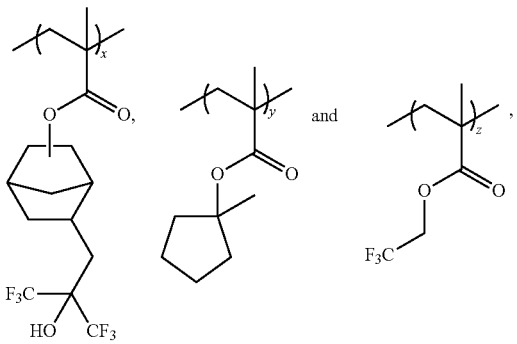

wherein x:y:z=1-30 mole %: 98-50 mole %: 1-49 mole % and x+y+z does not exceed 100 mole %; or

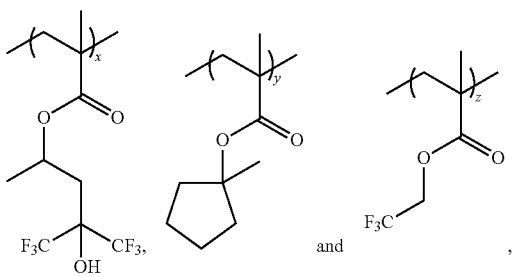

wherein x:y:z=1-30 mole %: 98-50 mole %: 1-49 mole % and x+y+z does not exceed 100 mole %; or

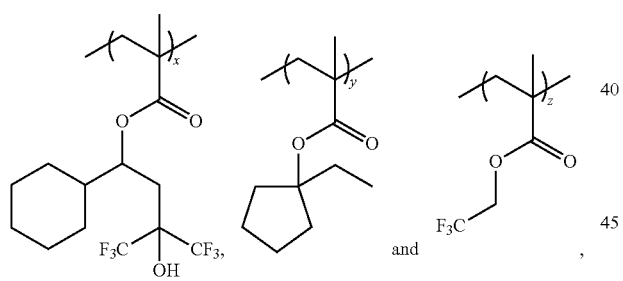

wherein x:y:z=1-30 mole %: 98-50 mole %: 1-49 mole % and x+y+z does not exceed 100 mole %; or

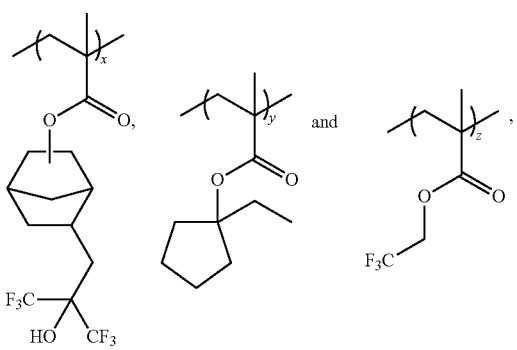

wherein x:y:z=1-30 mole %: 98-50 mole %: 1-49 mole % and x+y+z does not exceed 100 mole %; or

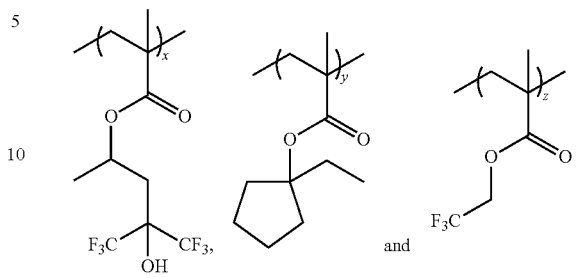

wherein x:y:z=1-30 mole %: 98-50 mole %: 1-49 mole % and x+y+z does not exceed 100 mole %.

2. The polymer of claim 1, wherein:
M1 comprises about 1 mole % to about 29 mole % of the repeat units, M2 comprises at least 70 mole % of the repeat units, and M3 comprises about 1 mole % to about 29 mole % of the repeat units.

3. The polymer of claim 1, wherein said polymer is hydrophobic in acidic aqueous solutions and hydrophilic in basic aqueous solutions.

4. The photoresist formulation of claim 1, wherein M1, M2 and M3 have the respective structures:

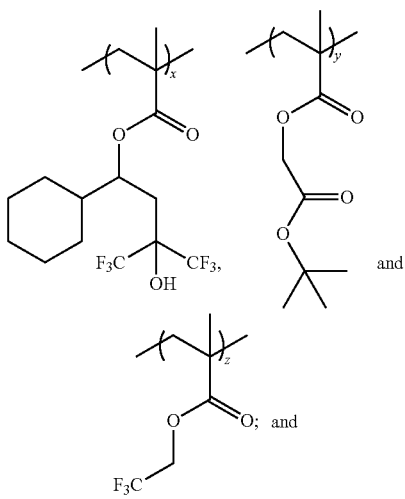

wherein x:y:z=1-30 mole %: 98-50 mole %: 1-49 mole % and x+y+z does not exceed 100 mole % of the repeat units of the photoresist additive polymer.

5. The photoresist formulation of claim 1, wherein M1, M2 and M3 have the respective structures:

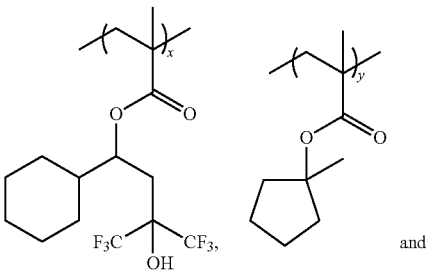

-continued

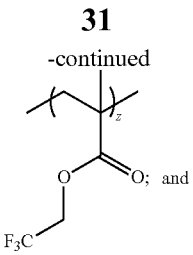

wherein x:y:z=1-30 mole %: 98-50 mole %: 1-49 mole % and x+y+z does not exceed 100 mole % of the repeat units of the photoresist additive polymer.

6. The photoresist formulation of claim 1, wherein M1, M2 and M3 have the respective structures:

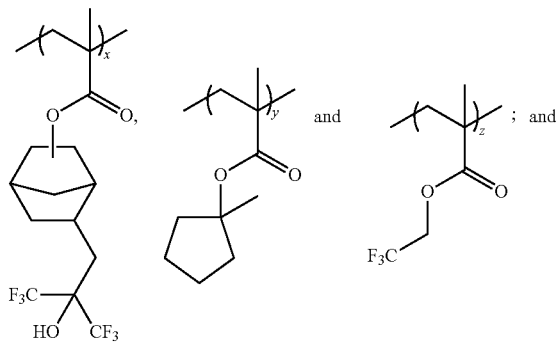

wherein x:y:z=1-30 mole %: 98-50 mole %: 1-49 mole % and x+y+z does not exceed 100 mole % of the repeat units of the photoresist additive polymer.

7. The photoresist formulation of claim 1, wherein M1, M2 and M3 have the respective structures:

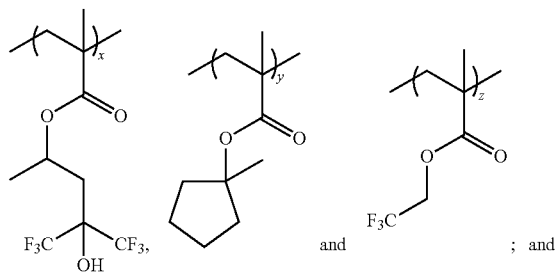

wherein x:y:z=1-30 mole %: 98-50 mole %: 1-49 mole % and x+y+z does not exceed 100 mole % of the repeat units of the photoresist additive polymer.

8. The photoresist formulation of claim 1, wherein M1, M2 and M3 have the respective structures:

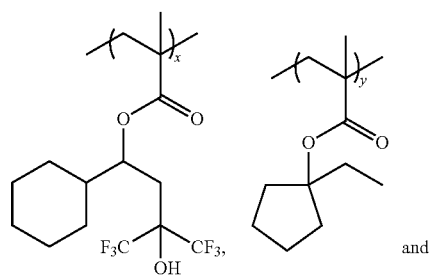

-continued

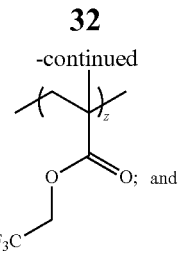

wherein x:y:z=1-30 mole %: 98-50 mole %: 1-49 mole % and x+y+z does not exceed 100 mole % of the repeat units of the photoresist additive polymer.

9. The photoresist formulation of claim 1, wherein M1, M2 and M3 have the respective structures:

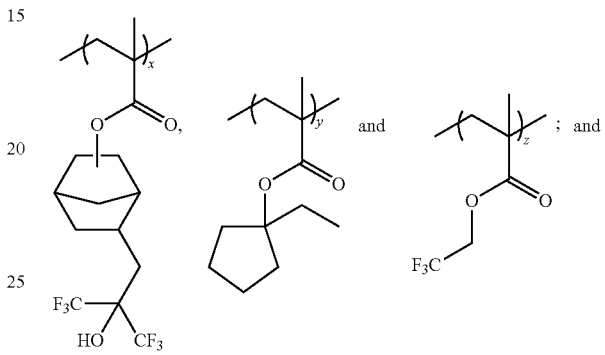

wherein x:y:z=1-30 mole %: 98-50 mole %: 1-49 mole % and x+y+z does not exceed 100 mole % of the repeat units of the photoresist additive polymer.

10. The photoresist formulation of claim 1, wherein M1, M2 and M3 have the respective structures:

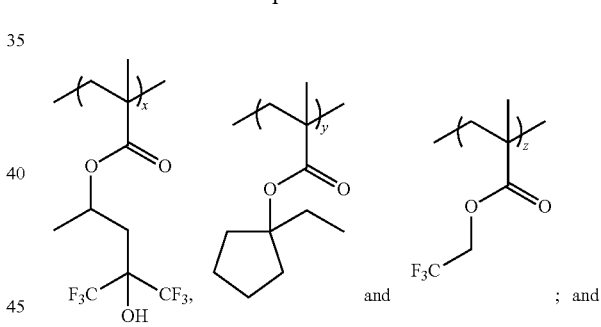

wherein x:y:z=1-30 mole %: 98-50 mole %: 1-49 mole % and x+y+z does not exceed 100 mole % of the repeat units of the photoresist additive polymer.

11. A photoresist formulation, comprising:
a photoresist polymer;
at least one photoacid generator;
a solvent; and
a photoresist additive polymer comprising repeat units with the following formulae:

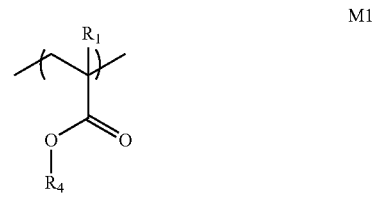

-continued

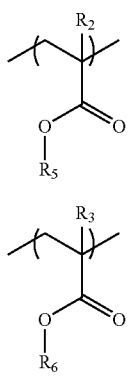

wherein:
- $R_1$, $R_2$, and $R_3$ are independently hydrogen, fluorine, alkyl, or fluoroalkyl;
- $R_4$ is (i) a linear, branched, or cyclic alkylene containing one or more fluoroalcohol groups that are unprotected or partially or fully protected with an acid-labile group, or (ii) a linear, branched or cyclic heteroalkylene containing one or more fluoroalcohol groups that are unprotected or partially or fully protected with an acid-labile group;
- $R_5$ is (i) a hydrogen or linear, branched, or cyclic alkylene group that is acid-labile, or (ii) a linear, branched or cyclic heteroalkylene group that is acid-labile, or (iii) a linear, branched, or cyclic alkylene group containing one or more carboxylic acid, sulfonamide, fluoroalcohol, or sulfonic acid moieties, that are unprotected or partially or fully protected with an acid-labile group, or (iv) a linear, branched or cyclic heteroalkylene group containing one or more carboxylic acid, sulfonamide, fluoroalcohol, or sulfonic acid moieties, that are unprotected or partially or fully protected with an acid-labile group;
- $R_6$ is a partially fluorinated or perfluorinated group, other than a fluorinated ether, that is acid-labile or non-acid labile; and
- M1 comprises about 1 mole % to about 30 mole % of the repeat units, M2 comprises at least 50 mole % of the repeat units, and M3 comprises about 1 mole % to about 49 mole % of the repeat units, and M1+M2+M3 does not exceed 100 mole %; and wherein M1, M2 and M3 have the respective structures:

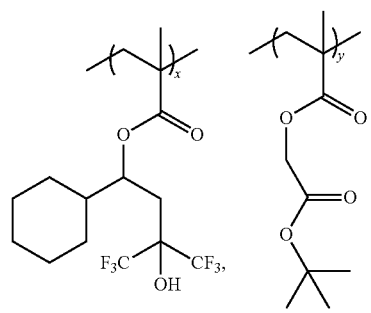

wherein x:y:z=1-30 mole %: 98-50 mole %: 1-49 mole % and x+y+z does not exceed 100 mole %; or

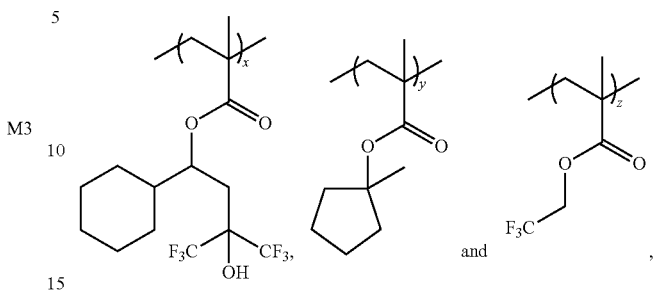

wherein x:y:z=1-30 mole %: 98-50 mole %: 1-49 mole % and x+y+z does not exceed 100 mole %; or

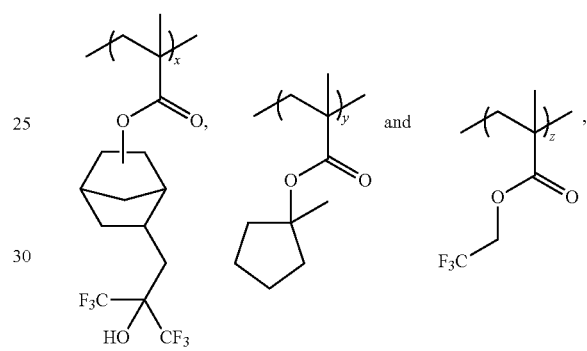

wherein x:y:z=1-30 mole %: 98-50 mole %: 1-49 mole % and x+y+z does not exceed 100 mole %;or

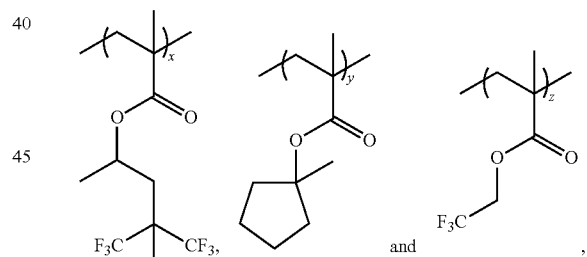

wherein x:y:z=1-30 mole %: 98-50 mole %: 1-49 mole % and x+y+z does not exceed 100 mole %; or

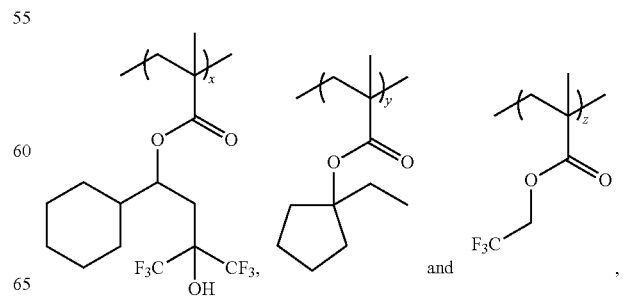

wherein x:y:z=1-30 mole %: 98-50 mole %: 1-49 mole % and x+y+z does not exceed 100 mole %; or

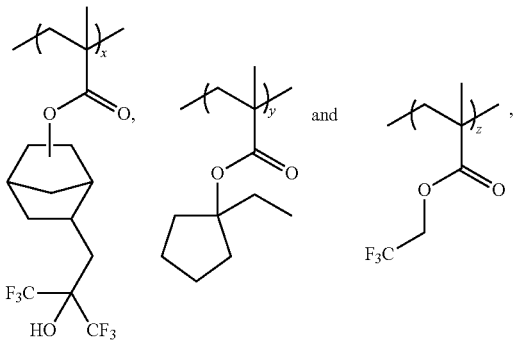

wherein x:y:z=1-30 mole %: 98-50 mole %: 1-49 mole % and x+y+z does not exceed 100 mole %; or

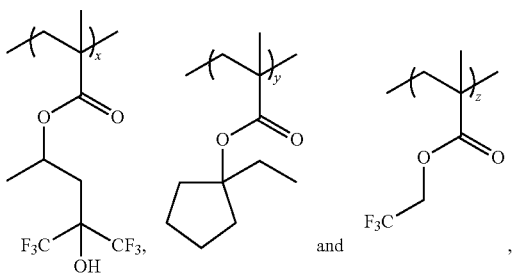

wherein x:y:z=1-30 mole %: 98-50 mole %: 1-49 mole % and x+y+z does not exceed 100 mole %.

12. The photoresist formulation of claim 11, wherein:
M1 comprises about 1 mole % to about 29 mole % of the repeat units, M2 comprises at least 70 mole % of the repeat units, and M3 comprises about 1 mole % to about 29 mole % of the repeat units of the photoresist additive polymer.

13. The photoresist formulation of claim 11, wherein said repeat units M1, M2 and M3 of said photoresist additive polymer have the respective structures:

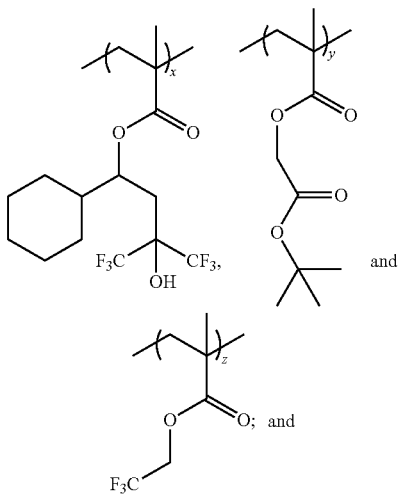

wherein x:y:z=1-30 mole %: 98-50 mole %: 1-49 mole % and x+y+z does not exceed 100 mole % of the repeat units of the photoresist additive polymer.

14. The photoresist formulation of claim 11, wherein said repeat units M1, M2 and M3 of said photoresist additive polymer have the respective structures:

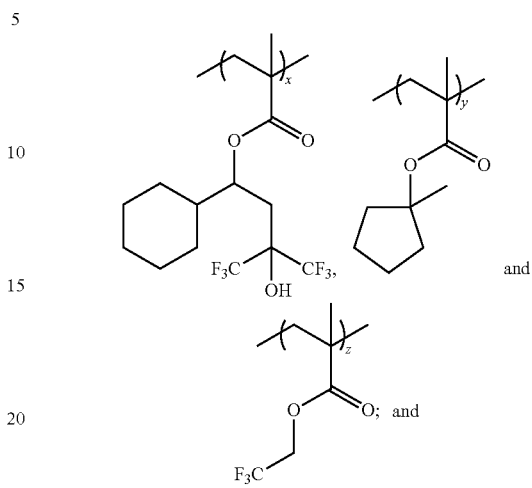

wherein x:y:z=1-30 mole %: 98-50 mole %: 1-49 mole % and x+y+z does not exceed 100 mole % of the repeat units of the photoresist additive polymer.

15. The photoresist formulation of claim 11, wherein said repeat units M1, M2 and M3 of said photoresist additive polymer have the respective structures:

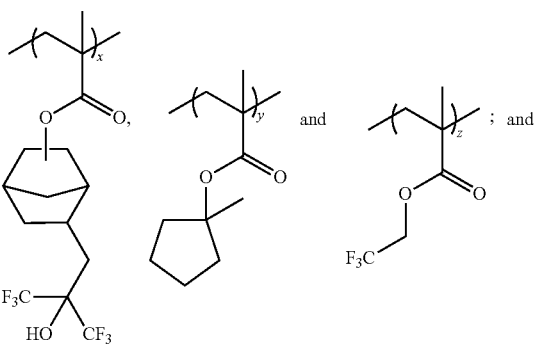

wherein x:y:z=1-30 mole %: 98-50 mole %: 1-49 mole % and x+y+z does not exceed 100 mole % of the repeat units of the photoresist additive polymer.

16. The photoresist formulation of claim 11, wherein said repeat units M1, M2 and M3 of said photoresist additive polymer have the respective structures:

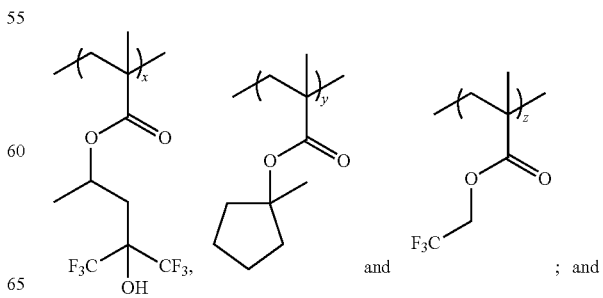

wherein x:y:z=1-30 mole %: 98-50 mole %: 1-49 mole % and x+y+z does not exceed 100 mole % of the repeat units of the photoresist additive polymer.

17. The photoresist formulation of claim 11, wherein said repeat units M1, M2 and M3 of said photoresist additive polymer have the respective structures:

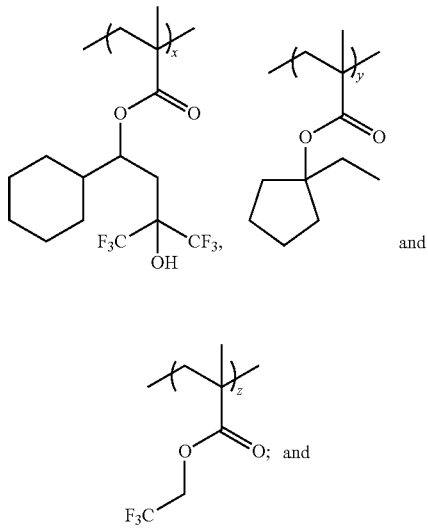

wherein x:y:z=1-30 mole %: 98-50 mole %: 1-49 mole % and x+y+z does not exceed 100 mole % of the repeat units of the photoresist additive polymer.

18. The photoresist formulation of claim 11, wherein said repeat units M1, M2 and M3 of said photoresist additive polymer have the respective structures:

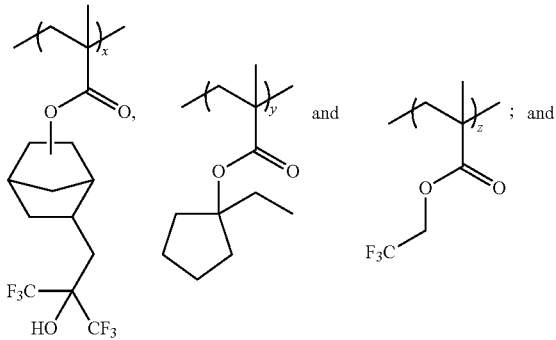

wherein x:y:z=1-30 mole %: 98-50 mole %: 1-49 mole % and x+y+z does not exceed 100 mole % of the repeat units of the photoresist additive polymer.

19. The photoresist formulation of claim 11, wherein said repeat units M1, M2 and M3 of said photoresist additive polymer have the respective structures:

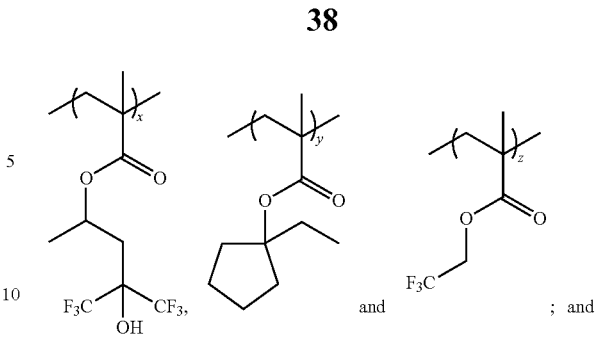

wherein x:y:z=1-30 mole %: 98-50 mole %: 1-49 mole % and x+y+z does not exceed 100 mole % of the repeat units of the photoresist additive polymer.

20. The photoresist formulation of claim 11, wherein said photoresist additive polymer is between about 2% by weight and about 5% by weight of the total solids content of said photoresist composition.

21. The photoresist formulation of claim 11, wherein a property of said photoresist formulation as measured by a receding water contact angle measurement results in a receding water contact angle of greater than 55°, said receding water contact angle being an angle between a tangent of a drop of water on a top surface of photoresist formation and said top surface of said photoresist formulation.

22. The photoresist formulation of claim 11, wherein a property of said photoresist formulation as measured by an advancing water contact angle measurement results in a an advancing water contact angle of less than 95°, said advancing water contact angle being an angle between a tangent of a drop of water on a top surface of photoresist formation and said top surface of said photoresist formulation.

23. A method, comprising:
    (a) forming a material layer on a top surface of a substrate;
    (b) coating the material layer with a photoresist formulation according to claim 11 to form a photoresist layer;
    (c) exposing said photoresist layer to actinic radiation through a patterned photomask to form exposed regions in said photoresist layer, thereby forming an exposed photoresist layer; and
    (d) developing said exposed photoresist layer in an aqueous alkaline solution to generate a patterned photoresist layer wherein regions of said photoresist layer are removed to expose corresponding regions of said material layer.

24. The method of claim 23, wherein (c) further includes: immersing said photoresist layer in a water based immersion fluid.

25. The method of claim 23, further including:
    (i) between (b) and (c) heating said photoresist layer to a first temperature greater than room temperature, (ii) between (c) and (d) heating said photoresist layer to a second temperature greater than room temperature, or (iii) between (b) and (c) heating said photoresist layer to said first temperature greater than room temperature and between (c) and (d) heating said photoresist layer to said second temperature greater than room temperature.

26. The method of claim 23, further including:
    (i) removing said corresponding regions of said material layer or performing an ion implantation into said corresponding regions of said material layer.

* * * * *